US008362450B2

(12) United States Patent
Iizuka et al.

(10) Patent No.: US 8,362,450 B2
(45) Date of Patent: Jan. 29, 2013

(54) ELECTRON BEAM DRIFT CORRECTION METHOD AND ELECTRON BEAM WRITING METHOD

(75) Inventors: Osamu Iizuka, Shizuoka (JP); Kiyoshi Hattori, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 1107 days.

(21) Appl. No.: 11/477,601

(22) Filed: Jun. 30, 2006

(65) Prior Publication Data

US 2007/0023689 A1   Feb. 1, 2007

(30) Foreign Application Priority Data

Jul. 4, 2005   (JP) .................................. 2005-194930
May 12, 2006   (JP) .................................. 2006-133873

(51) Int. Cl.
*G21K 1/00*   (2006.01)
(52) U.S. Cl. .................... 250/492.22; 250/492.1
(58) Field of Classification Search .................... None
See application file for complete search history.

(56) References Cited

U.S. PATENT DOCUMENTS

| 3,894,271 | A | * | 7/1975 | Pfeiffer et al. ................. 315/384 |
| 4,807,159 | A | | 2/1989 | Komatsu et al. |
| 4,818,885 | A | * | 4/1989 | Davis et al. ................. 250/492.2 |
| 5,113,072 | A | * | 5/1992 | Yamaguchi et al. ............. 850/16 |
| 5,315,123 | A | * | 5/1994 | Itoh et al. .................... 250/492.2 |
| 5,345,085 | A | * | 9/1994 | Prior ........................... 250/491.1 |
| 5,391,886 | A | * | 2/1995 | Yamada et al. .......... 250/492.22 |
| 5,843,603 | A | * | 12/1998 | Ando et al. ..................... 430/30 |
| 6,242,751 | B1 | * | 6/2001 | Takemoto et al. ........ 250/492.22 |
| 6,573,516 | B2 | * | 6/2003 | Kawakami ............... 250/492.21 |
| 6,888,149 | B2 | | 5/2005 | Ikku |
| 7,043,848 | B2 | * | 5/2006 | Hollman et al. ................. 33/556 |
| 7,138,629 | B2 | * | 11/2006 | Noji et al. ...................... 250/311 |
| 2001/0013581 | A1 | * | 8/2001 | Takemoto et al. ........ 250/492.22 |
| 2002/0096645 | A1 | * | 7/2002 | Kawakami .................. 250/492.1 |
| 2002/0117635 | A1 | * | 8/2002 | Shinada et al. ............. 250/492.3 |
| 2003/0071231 | A1 | * | 4/2003 | Haraguchi et al. ....... 250/492.22 |
| 2003/0111616 | A1 | * | 6/2003 | Suzuki et al. ............... 250/492.2 |
| 2003/0164460 | A1 | * | 9/2003 | Shinada et al. ............. 250/492.3 |

FOREIGN PATENT DOCUMENTS

| JP | 1-276546 | | 11/1989 |
| JP | 01294343 | A * | 11/1989 |
| JP | 3-114125 | | 5/1991 |
| JP | 5-82426 | | 4/1992 |
| JP | 6-36997 | | 2/1994 |
| JP | A-07-142321 | | 6/1995 |
| JP | 09-260247 | | 10/1997 |
| JP | 09260247 | A * | 10/1997 |
| JP | 10-199786 | | 7/1998 |
| JP | 2000-058424 | | 2/2000 |
| JP | 2000-133567 | | 5/2000 |

(Continued)

*Primary Examiner* — David A Vanore
*Assistant Examiner* — Andrew Smyth
(74) *Attorney, Agent, or Firm* — Oblon, Spivak, McClelland, Maier & Neustadt, L.L.P.

(57) ABSTRACT

A method for correcting drifts of an electron beam, includes periodically correcting drift of the electron beam once per time period while varying the time period in length, and correcting, in addition to the correction per time period, the drift of the electron beam regardless of elapse of said time period when a change in value of a specified disturbance factor occurs with a prespecified change amount.

16 Claims, 21 Drawing Sheets

FOREIGN PATENT DOCUMENTS

| | | | |
|---|---|---|---|
| JP | 2000133567 A * | 5/2000 | |
| JP | 2000-349021 | 12/2000 | |
| JP | 2003-188075 | 7/2003 | |
| TW | 495834 | 7/2002 | |
| TW | 574631 | 2/2004 | |
| TW | 1230838 | 4/2005 | |

* cited by examiner

ELECTRON BEAM DRIFT CORRECTION METHOD AND ELECTRON BEAM WRITING METHOD

CROSS-REFERENCE TO RELATED APPLICATION

This application claims priority to Japanese Patent Application No. 2005-194930, filed Jul. 4, 2005 and Japanese Patent Application No. 2006-133873, filed May 12, 2006, the disclosure of which is incorporated herein by reference.

FIELD OF THE INVENTION

The present invention relates generally to energy radiation photolithography technologies and, more particularly, to methodology for using a charged particle beam, such as an electron beam, to form a pattern on a target workpiece. More particularly but not exclusively, the invention relates to beam drift correction techniques for use in electron beam pattern writing or "drawing" apparatus.

RELATED ART OF THE INVENTION

Microlithography techniques promise advances in miniaturization of semiconductor devices and are becoming more important in the formation of highly integrated on-chip circuit patterns among semiconductor fabrication processes. In recent years, as ultralarge-scale integrated (ULSI) chips further increase in integration, circuits on semiconductor substrates decrease in minimum feature size, resulting in pattern line widths becoming finer year by year. To form or "write" a desired pattern on semiconductor chip substrates, an original or "master" pattern of high precision is needed, such as reticles, photomasks or else. Typically, electron lithography techniques are used for manufacture of such high-precision master patterns, as these offer enhanced image resolution characteristics.

See FIG. 24, which shows some major components of a prior known variable-shaped electron beam exposure apparatus for explanation of an operation thereof. As shown herein, this EB exposure tool includes a couple of spaced-apart aperture plates 410 and 420. The upper aperture 410 has a rectangular opening 411, which shapes an electron beam leaving a charge particle source 430 and then falling onto aperture 410. The lower aperture 420 has a variable shaping opening 421 for shaping the electron beam 330 that has passed through the upper aperture opening 411 into a desired rectangular cross-section. After penetration of the aperture opening 411, the electron beam 330 is deflected by a deflector to pass through part of the lower aperture opening 421, resulting in irradiation onto a target workpiece which 340 is placed on a stage that is movable in a one direction, e.g., X-axis direction. In short, only a specific pattern with a rectangular cross-section capable of passing through both aperture openings 411 and 420 is irradiated or "shot" onto the workpiece surface so that an image of the intended pattern is formed in the aimed exposure region of workpiece 340 on the stage moving along the X direction. This approach to forming a desired shape by letting the beam penetrate both the aperture holes 411 and 421 is called the "variable shaping," as disclosed, for example, in JP-A-2000-58424.

Upon start-up of a pattern writing operation, the electron beam emitted is guided to fall onto a target workpiece, resulting in production of electrons as reflected therefrom. These reflected electrons collide with optics and detectors in EB lithography apparatus and are charged up resulting in creation of a "new" electric field. Due to this field creation, the electron beam being deflected to travel toward the workpiece can go away from its orbit. This orbit change is called the "beam drift." The beam drift is hardly predictable, so it is very difficult to provide an effective way of correcting the beam drift through estimation without measurement. Prior known EB lithography tools are usually designed to employ a technique for recurrently measuring and correcting beam drifts at predetermined time intervals in a once-at-a-time fashion.

A method for correcting electron beam drift is disclosed in JP-A-7-142321, which includes the steps of determining the next measurement startup time point in accordance with a change rate of a deflection amount (i.e., beam drift quantity), and measuring at this time point a present drift amount for correction thereof. Another beam drift correction method is found in JP-A-10-199786, which teaches a technique for starting pattern depiction after repeated execution of beam drift correction until a drift amount measured after drift correction comes to fall within a prespecified threshold value range. Other relevant techniques are taught by some documents. One example is a technique for dividing a transfer pattern into a plurality of regions and for determining a drift correction time interval in units of such regions, as disclosed in JP-A-9-260247. Another example is a scheme for determining in advance the relationship between a stage temperature and workpiece position offset and for correcting a position offset by a prespecified quantity without measurement of the actual position offset amount with a change in temperature, as disclosed in JP-A-2003-188075.

Note here that the electron beam drift amount exhibits a tendency that its value is relatively large within the initial period immediately after startup of beam irradiation and, thereafter, it gradually gets smaller with time. In view of this nature, if drift correction is simply performed at fixed time intervals having a length which is made equal to that in the initial period with the risk of appreciable beam drifts while forcing the pattern depiction to be interrupted on each occasion, then the number of drift correction operations increases accordingly, resulting in an increase in depiction time and thus a decrease in throughput.

To reduce the drift correction number, the above-identified Japanese document JP-A-7-142321 discloses therein a technique for narrowing the drift correction intervals in the initial drift period and, thereafter, gradually widening the intervals as the beam drift amount decreases. However, beam drifts can also be occurred by other causes except the one stated above—i.e., due to the presence of disturbances. These disturbances occur irregularly and unexpectedly at any time during pattern writing. To avoid such disturbance-brought beam drifts, the method of JP-A-7-142321 is designed to put a limit to the maximum value of the drift correction interval length so that it is not greater than a few minutes, e.g., three minutes. This poses another problem as to insufficiency of the drift correction number reducibility.

Additionally, beam deflectors can decrease in deflection sensitivity due to disturbances. A decrease in deflection sensitivity causes the beam to deviate in its irradiation position. Unfortunately, prior art approaches fail to provide any successful technique for compensating such deflection sensitivity degradation. In addition, while a Z-axis or "Z" sensor is used to detect a position in a Z-axis direction on the pattern depiction surface of a target workpiece, it will possibly happen that its optical axis is displaced or offset due to disturbances. This Z-sensor axis offset occurrable during pattern depiction is a serious bar to achieving high-accuracy pattern writing. Prior art EB lithography systems fail to provide any effective remedy for such Z-sensor axis variations.

BRIEF SUMMARY OF THE INVENTION

An object of one currently preferred form of the present invention is to provide an electron beam drift correction method capable of avoiding the problems and further reducing in number beam drift correction processes while handling disturbances. An object of another form of the invention is to provide an electron beam writing method with an ability to suppress degradation of pattern depiction accuracy.

In accordance with one aspect of this invention, a method for correcting drift of an electron beam is provided, which includes periodically correcting drift of the electron beam once per unit of time period while modifying the time period, and correcting, in addition to the periodical correction, the drift of the electron beam regardless of elapse of the time period whenever a change in value of a specified disturbance factor occurs with a prespecified change amount.

In accordance with another aspect of the invention, an electron beam drift correction method includes (a) periodically correcting drift of an electron beam once per elapse of a time period, and (b) providing a trigger for start-up of drift correction of the electron beam in a way independent of step (a).

In accordance with still another aspect of the invention, a method for correcting drift of an electron beam after elapse of a specified time period from startup of irradiation of the electron beam is provided. This method includes measuring a value of certain disturbance factor, measuring a drift degree of the electron beam when the measured value of the disturbance factor reaches a predetermined change amount, and correcting a deflection amount thereof based on the measured drift degree of the electron beam.

In accordance with a further aspect of the invention, an electron beam writing method includes drawing or "writing" using an electron beam deflectable by a deflector, measuring during the writing a value of certain disturbance factor, measuring a drift amount of the electron beam when the measured value of the disturbance factor reaches a predefined change level, and correcting a deflection degree of the electron beam based on the measured drift amount of the electron beam to.

In accordance with another further aspect of the invention, an electron beam writing method includes writing by use of an electron beam being deflected by a deflector, measuring during the writing a value of a chosen disturbance factor, and measuring, when the measured value of the disturbance factor reaches a predefined change level, a deflection position of the electron beam within a deflection range of the deflector.

In accordance with yet another further aspect of the invention, an electron beam writing method includes writing by use of an electron beam on a workpiece with its position along a Z-axis direction being detected by a Z sensor, and measuring during the writing a value of a disturbance factor. When the measured value of the disturbance factor reaches a predetermined change level, use a mark as provided on or above a stage with the workpiece being placed thereon to measure a position of the mark in the Z direction. Then, correct an offset value of the Z sensor based on the measured position in the Z direction.

DETAILED DESCRIPTION OF THE INVENTION

Several photolithographic arrangements using a charged particle beam, such as an electron beam, will be described below. The charged particle beam may alternatively be an ion beam when the need arises. The description below is mainly directed to variable-shaped electron beam writing apparatus as an example of a charged particle beam apparatus and electron beam drift correction methodology for use therewith.

Embodiment 1

Figure 1:
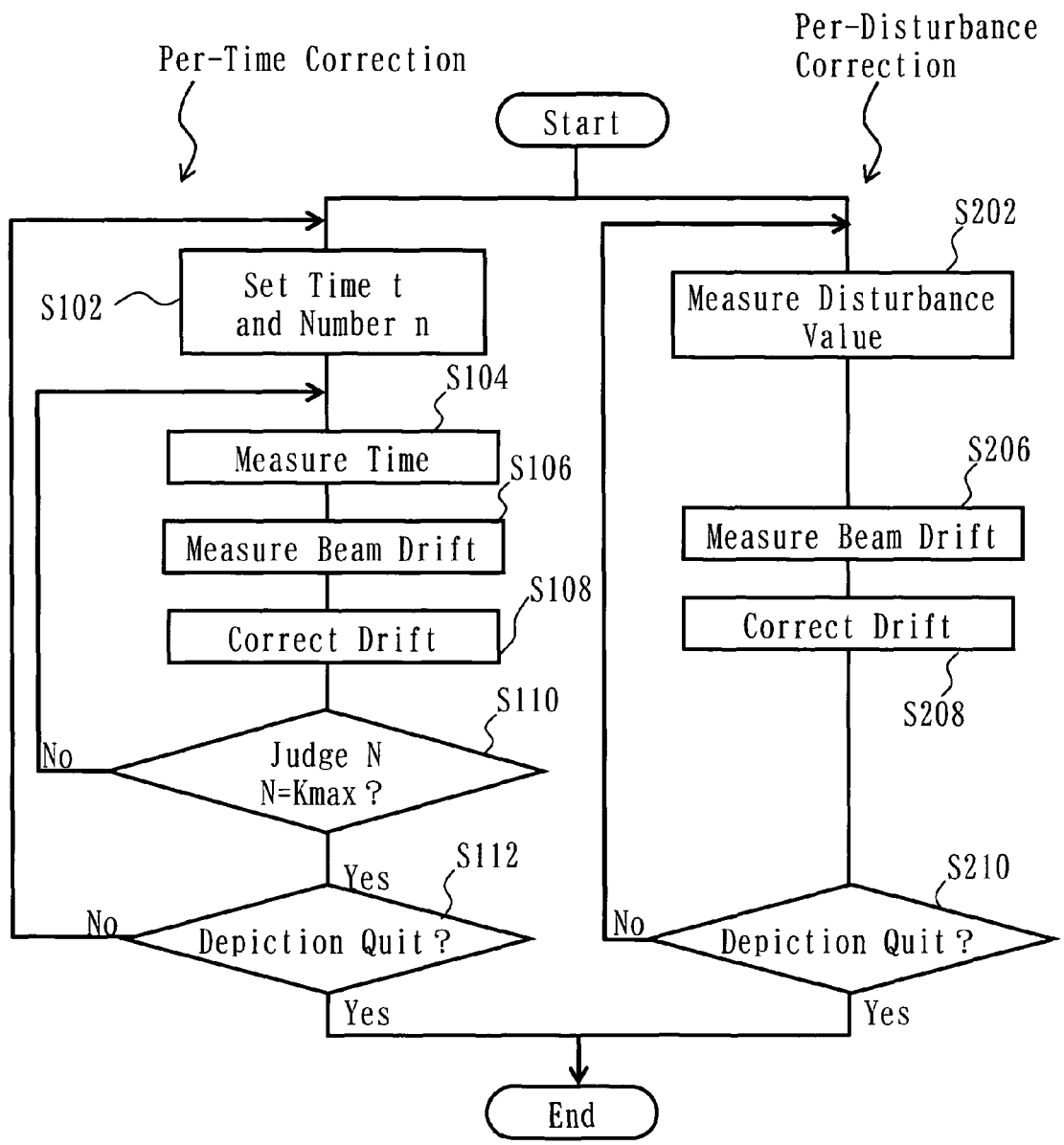
FIG. 1 is a flow chart of some major process steps in an electron beam drift correction method embodying the invention.
Figure 2:
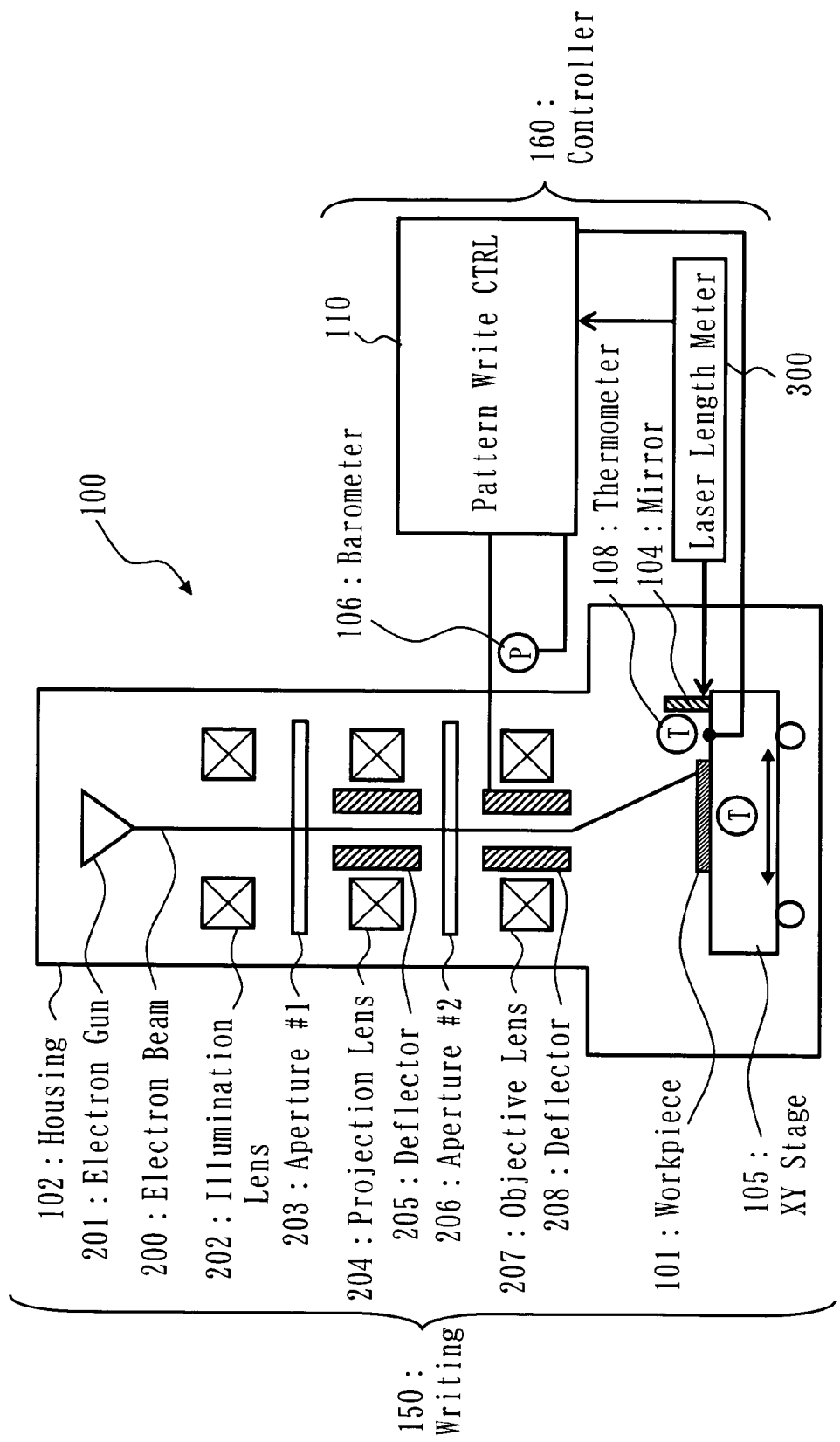
FIG. 2 is a diagram showing a configuration of an electron beam microlithographic pattern writing apparatus for use with the beam drift correction method of FIG. 1.

Referring to FIG. 1, main part of an electron beam drift correction method in accordance with a first embodiment of the invention is shown, which method is for use with an electron beam (EB) photolithography apparatus shown in FIG. 2. As shown in FIG. 1, the beam drift correction method includes a per-time correction process and a per-event correction process, wherein the former is for periodically performing electron beam drift correcting operations once per elapse of unit of time period while letting this unit time be variable in length whereas the latter is to perform electron beam drift correction, irrespective of the elapse of unit time, at any time when a change in value of certain kind of disturbance factor becomes equal to or greater than a prespecified level. The per-time or "regular" correction process performs a series of processes at steps which follow: a setup step S102 of setting up a correction time period "t" and a correction number "n", a time period measuring step S104, a beam drift measuring step S106, a drift correction step S108, a correction number judgment step S110, and a depiction quit decision step S112. The per-disturbance correction process includes a series of steps including a disturbance factor measurement step S202, beam drift amount measurement step S206, drift correction step S208, and pattern-write quit decision step S210.

As shown in FIG. 2, the EB writing apparatus 100 includes a pattern drawing or "writing" unit 150 and a control unit 160. The former unit 150 is generally made up of a tower-like housing 102 called an electron lens barrel, movable X-Y stage 105, electron gun assembly 201, illumination lens 202, upper or "first" aperture 203, projection lens 204, deflector 205, lower or "second" aperture 206, objective lens 207, and deflector 208. On the top surface of XY stage 105, a mirror 104 and thermometer 108 are disposed. An instrument 106 for measurement of atmospheric pressure, such as barometer, is disposed outside of the electron lens barrel 102. The control unit 160 includes a pattern depiction control circuit 110 and laser-assisted length measurement device 300. Other known parts or components are included in the EB lithography apparatus 100, although these are not specifically illustrated in FIG. 1.

An electron beam 200 leaving the electron gun 201 passes through the illumination lens 202 to enter the first aperture 203, which has a rectangular beam-shaping opening or hole. Passing this hole results in the electron beam 200 being shaped to have a rectangular cross-section. Then, the electron beam 200 is guided by the projection lens 204 to reach the second aperture 206. A first aperture image on second aperture 206 is position-controlled by the deflector 205 so that the beam changes in shape and in size dimensions. After having passed through second aperture 206, the electron beam 200 with a second aperture image is focus-adjusted by the objective lens 207 and then deflected by the deflector 208 to finally fall onto a target workpiece 101 at a desired position thereon, which workpiece is placed on the movable XY stage 105. A present location of XY stage 105 is optically measured on a real-time basis in such a way that the laser device 300 emits a beam of laser light hitting the mirror 104 on XY stage 105 and then receives reflected light from mirror 104.

Figure 3:
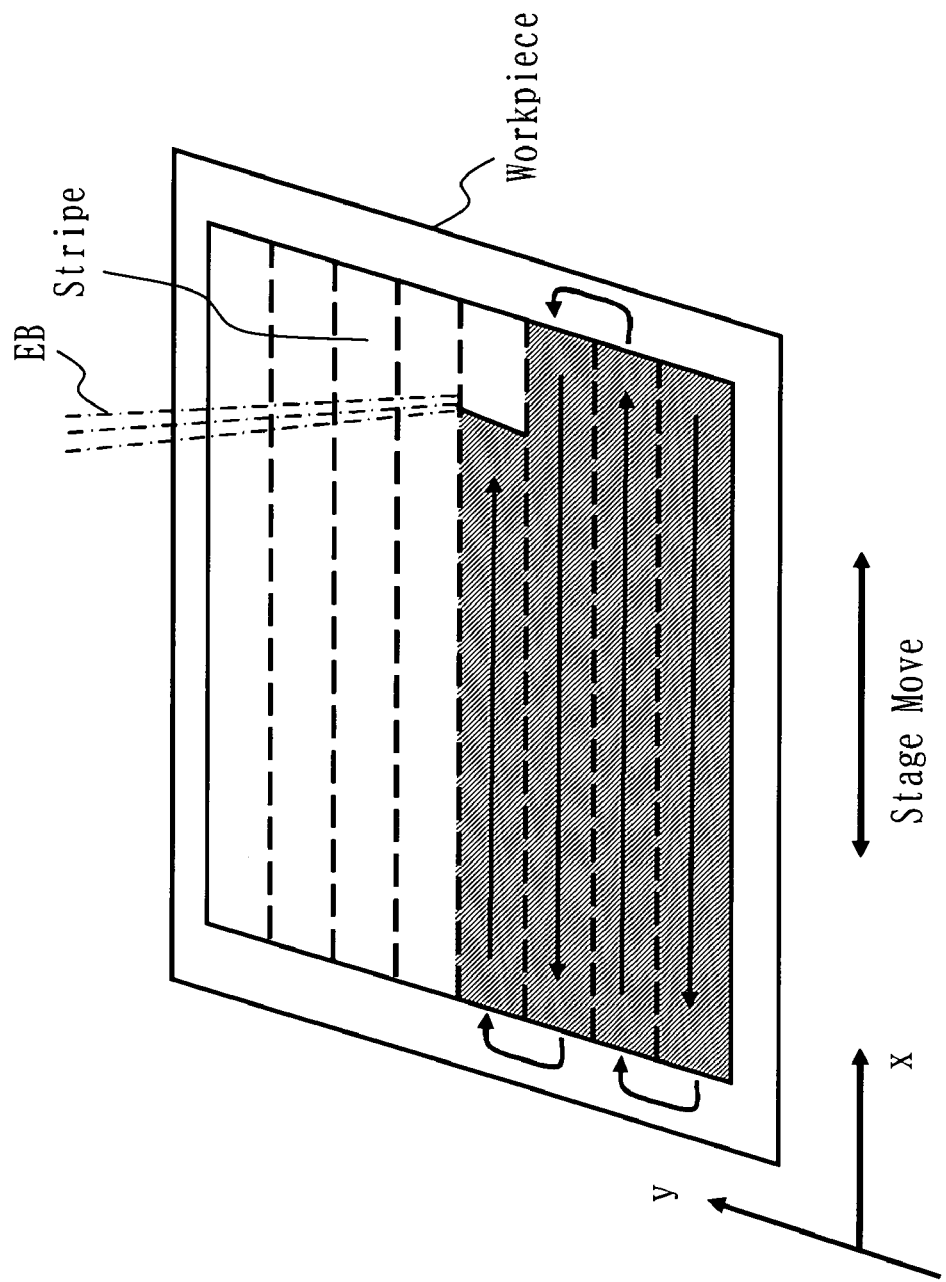
FIG. 3 is a perspective view of a target workpiece as mounted on a movable X-Y stage structure of the apparatus.

As shown in FIG. 3, the workpiece 101 has an exposure surface on which a pattern image is to be written. This surface is virtually subdivided into a plurality of strip-like beam-deflectable portions. When writing the pattern on workpiece 101, the XY stage 105 is driven by a known actuator (not shown) to move or slide continuously in the X direction so that the incoming electron beam 200 scans one stripe area along the length thereof. During the movement of XY stage 105 in the X direction, let the shot position of electron beam on workpiece 101 follow or "trace" the stage motion in a way synchronous therewith. This makes it possible to shorten a time taken to complete the pattern depiction required. After having written a pattern in one stripe of workpiece 101, the XY stage 105 is driven by the actuator (not shown) to move in step along the Y direction and then move backward in X direction so that the incoming beam scans the next stripe for execution of pattern writing thereto. In other words, XY stage 105 alternately performs continuous forward/backward movements in X direction and movements in steps along Y direction, thereby permitting the beam 200 to scan respective exposure stripes of workpiece 101 on XY stage 105 in a serpentine fashion. With this serpentine stage motion control, it is possible to minimize any possible idle time during movement of XY stage 200, thereby to increase or maximize the efficiency of stage motion-control operation.

Figure 4:
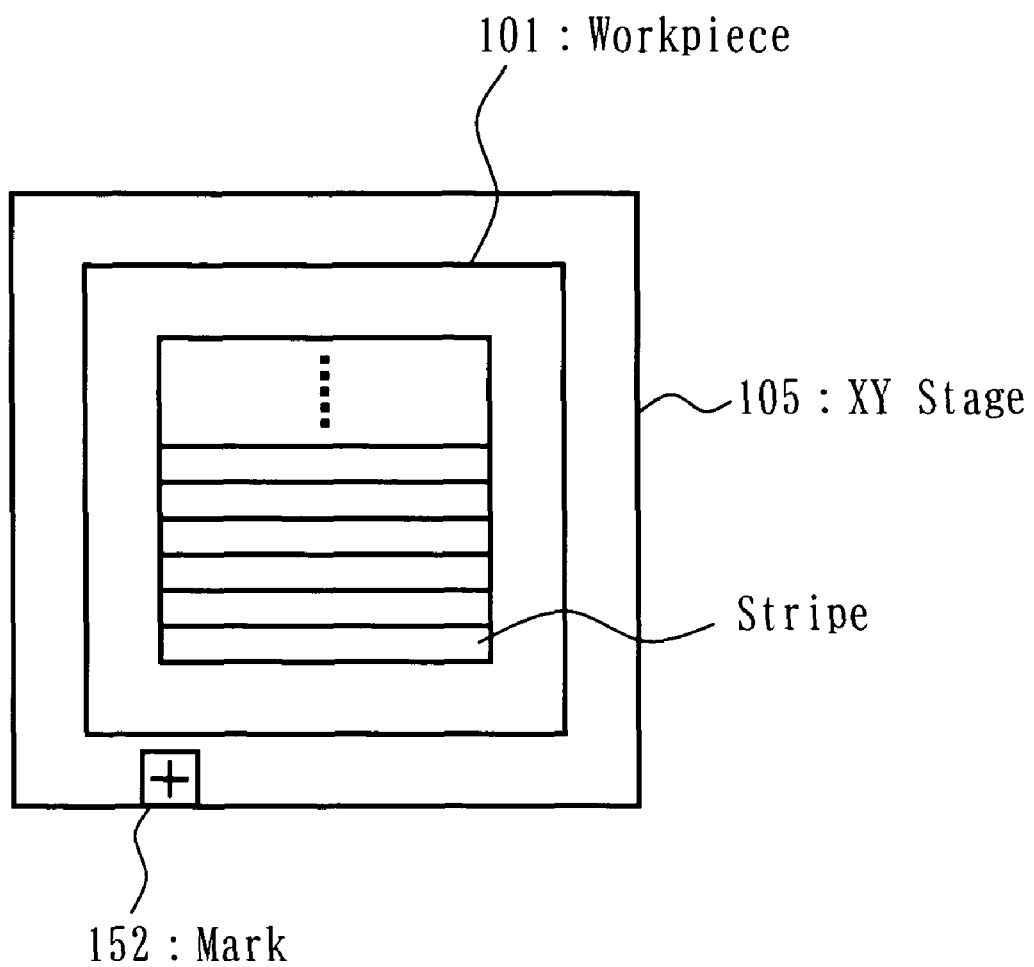
FIG. 4 is a plan view of the XY stage having thereon a reference position indicator mark.

A plan view of the XY stage 105 which supports thereon the workpiece 101 is shown in FIG. 4. As shown herein, XY stage 105 has on its top surface a reference position marking 152 for beam calibration use, which is used for inspection of a drift amount of the electron beam 200. The thermometer 108 and mirror 104 are eliminated from the illustration for brevity purposes only.

Figure 5:
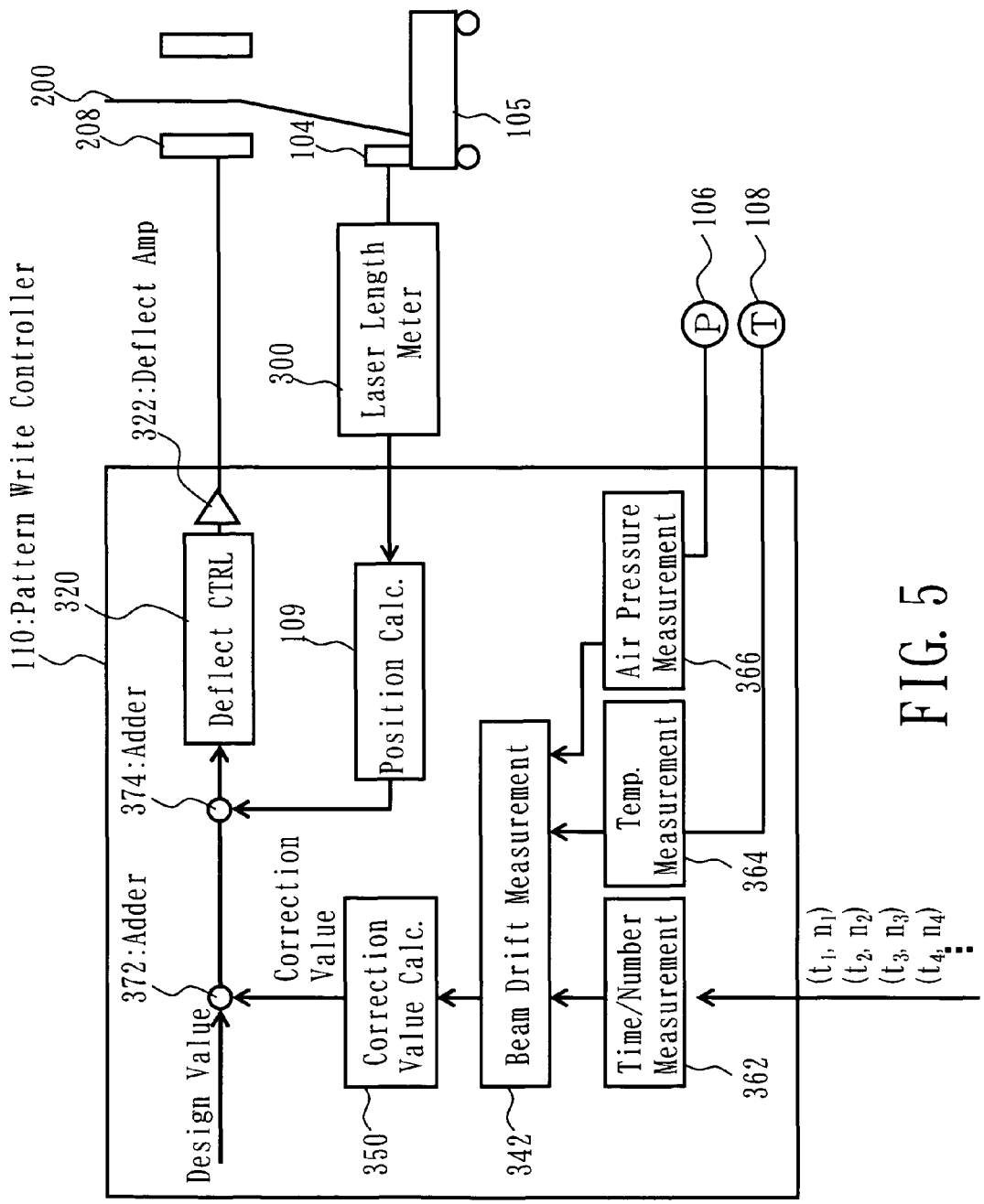
FIG. 5 illustrates, in block diagram form, an internal configuration of beam drift correction control circuitry.

The pattern-write control circuit 110 of FIG. 2 provides controls as to the beam drift correction method shown in FIG. 1. As shown in FIG. 5, this controller 110 includes a beam deflection control circuit 320, deflection amplifier 322, beam drift measurement circuit 342, correction value calculating circuit 350, time period/number-of-times measurement circuit 362, temperature measurement circuit 364, air pressure measurement circuit 366, adders 372-374, and position processor circuit 109. The deflection amp 322 applies a voltage to the deflector 208, resulting in the electron beam 200 being electrostatically deflected. A data signal indicative of a measurement length value as output from the laser meter device 300 is arithmetically processed by the position processor 109 for conversion to position data. The illustrative controller 110 includes other known components and/or circuits although these are not specifically shown in FIG. 5.

Figure 6:
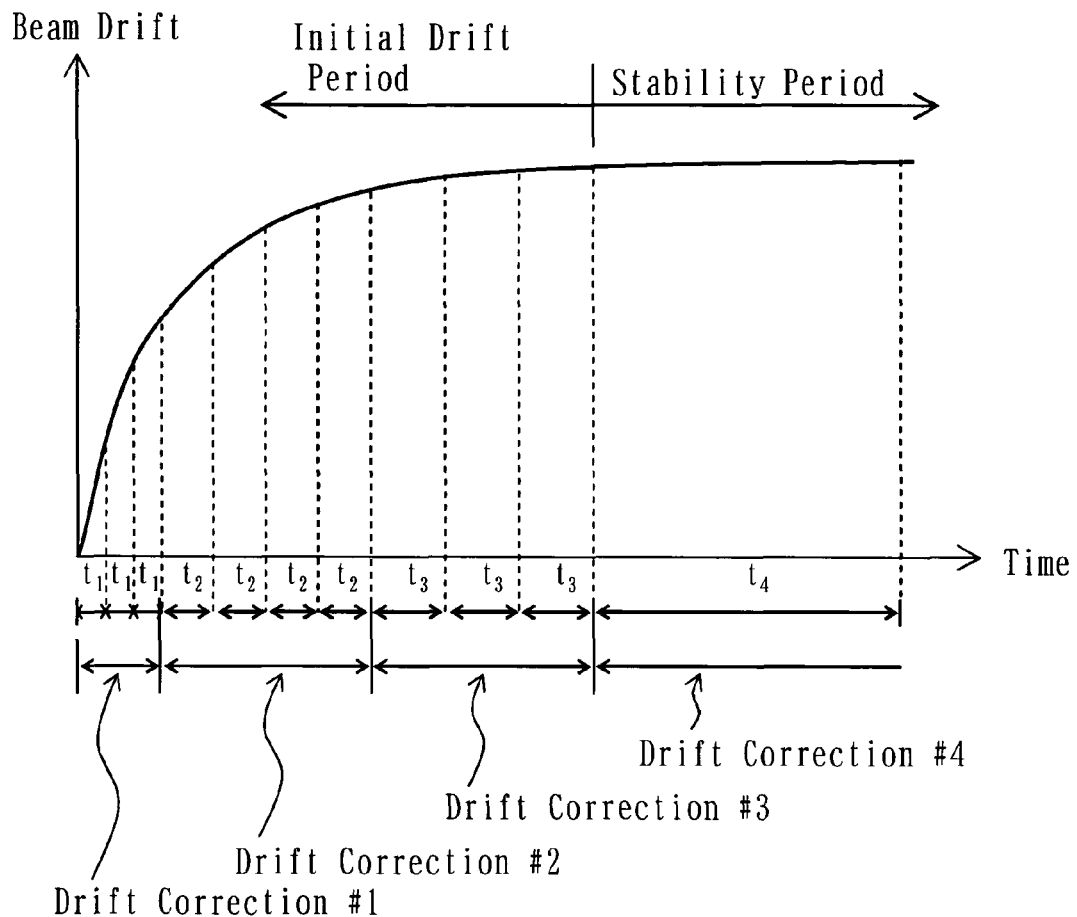
FIG. 6 is a graph showing a curve of beam drift versus time.

During irradiation of the electron beam 200 for pattern writing on the workpiece 101, this beam gives rise to drifting. As shown in FIG. 6, at the very beginning of such beam emission, certain kind of beam drifting can take place by the electron beam 200 per se or by irradiation mechanisms thereof. This drifting is known as an "initial drift." This initial drift is such that the beam drifting is relatively significant in change rate and tends to decrease in change with the elapse of time. Thereafter, the beam drift becomes smaller in change rate and is "saturated" in a period of stability as shown in FIG. 5.

In view of this, the electron beam drift correction method embodying the invention shown in FIG. 1 is arranged to shorten the execution interval of periodical drift correction operations immediately after irradiation of electron beam 200 with increased change rate—i.e., just after the startup of pattern writing on workpiece 101—and lengthen the drift correction interval as the pattern write proceeds with time. For example, as shown in FIG. 5, the initial drift period is divided into three time domains No. 1 to No. 3. In the first domain, beam drift correction is periodically performed for three times at equal intervals of t1. In its following second domain, drift correction is done four times at intervals t2 each being longer than t1. In the third domain next thereto, drift correction is executed three times at intervals t3 longer than t2. Thereafter, in the beam stabilized period, drift correction will be done at intervals t4 longer than t3. The beam correction interval t1 may be set to five minutes by taking account of the fact that the initial beam drifting is relatively large. The correction interval t2 is set to ten minutes as the beam drift decreases with time. The correction interval t3 is set at thirty minutes as the drift further decreases. The correction interval in the beam stability period is set to sixty minutes since no appreciable beam drift occurs. The number of time domain division is modifiable on a case-by-case basis. The same goes with the length setting of respective intervals t1 to t4 and also the number of recurrent execution of correction operations within each time domain.

Referring back to FIG. 1, the electron beam drift correction procedure starts with step S102 which sets up, upon startup of pattern write or prior to the startup, a correction time "t" and a correction number "n" to the time/number measurement circuit 362 of FIG. 5, which are to be used during a predefined first-time beam drift correction. For example, set up a pair of values t1 and n1 for use in the drift correction time domain #1 shown in FIG. 6.

The procedure goes next to step S104, which causes the time/number measurement circuit 362 to measure elapse of the correction time t.

Then, at step S106, measure the value of a beam drift amount. More specifically, the pattern writing apparatus 100 interrupts its operation at a time point at which the set time has passed, causing the beam calibration mark 152 on XY stage 105 to move toward a position corresponding to the center of objective lens 207 due to motion of the XY stage 105. Then, the beam drift amount measurement circuit 243 detects a cross-like or cruciform mark 152 through scanning by the electron beam 200, thereby measuring a drift amount.

At step S108, drift correction is performed. More specifically, the correction value calculator circuit 350 uses the beam drift amount as measured by the drift measurement circuit 342 to determine through arithmetic computation a drift correction value. This value is then passed to the adder 372, which adds the drift correction value to the original design data value to generate a synthetic value. Replacing the design data thereby results in correction of the beam drift being presently found. An output signal of adder 374 indicative of such corrected design data is then combined or "synthesized" together with the position data of XY stage 105 as has been measured by laser length meter 300 and calculated by position calculator 109, thereby generating an output signal indicative of the combined value data, which is then sent to the deflection control circuit 320. This circuit uses this data to control an output voltage of deflection amp 322, which voltage is then used for deflection of the electron beam 200 by the deflector 208.

At step S110, the time/number measurement circuit 362 determines whether the beam drift correction has been done for a number of times "n" as set in the time domain t1. If NO at step S110 then return to step S104, followed by repeated execution of operations at steps S104 to S110. If YES at step S104, i.e., upon completion of the first-time drift correction, then proceed to step S112.

In step S112, the controller 160 determines whether a present pattern writing session is completed. If NO then return at step S102, followed by reexecution of the processes of from step S102 to step S112. In a similar way, beam drift correction will be performed based on predefined correction schemes.

By varying the drift correction interval so that it becomes longer with elapse of time, it is possible to reduce the number of drift correction processes, thereby enabling likewise reduction of measurement and computation time periods as required for the beam drift correction processing. This in turn makes it possible to shorten or minimize the total length of a time taken to complete the pattern write required.

Figure 7:
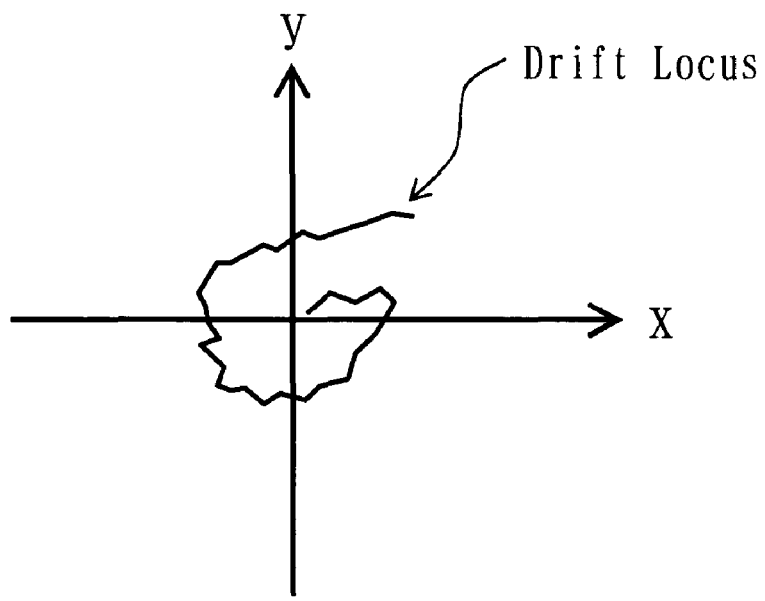
FIG. 7 shows one exemplary locus or "excursion" of beam drifting in the initial period thereof.
Figure 8:
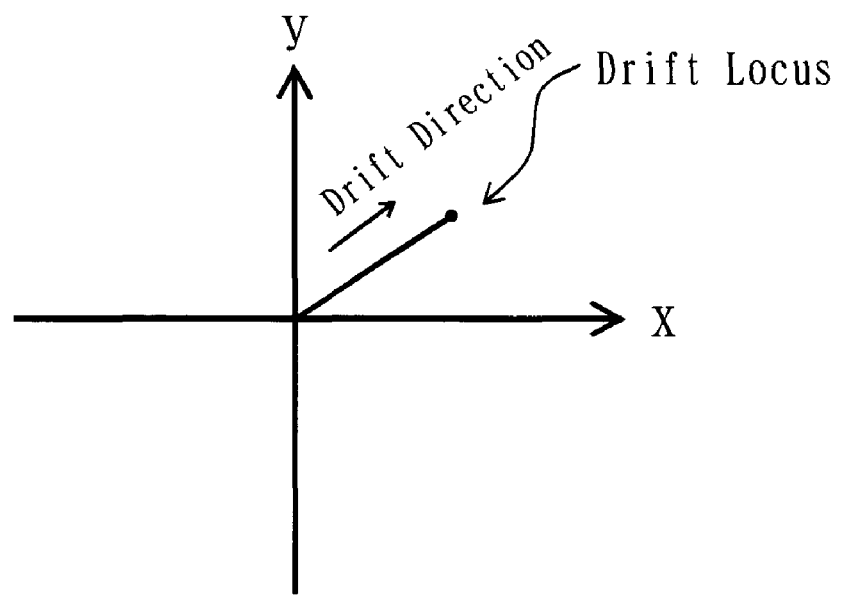
FIG. 8 shows an exemplary locus of drift in its period of stability.

An exemplary migration locus of the electron beam 200 in the initial drift period is shown in FIG. 7. In the beam stability period, this beam exhibits a locus such as shown in FIG. 8 as an example. More specifically, the initial drift with its change amount being relatively large tends to migrate irregularly as shown in FIG. 7. On the contrary, in the beam stability period after the elapse of a specified time, the drift change amount decreases and tends to have specific drift directionality or "directivity" as shown in FIG. 8. However, in order to more reliably ensure that the drift proceeds in a fixed direction, it is required that some disturbance factors, such as a temperature at the top surface of XY stage 105—i.e., a temperature of workpiece 101—and atmospheric pressure outside of the lithography apparatus 100 are kept less in variation. Alternatively it is required that such disturbance factors uniformly vary in fixed directions.

Figure 9:
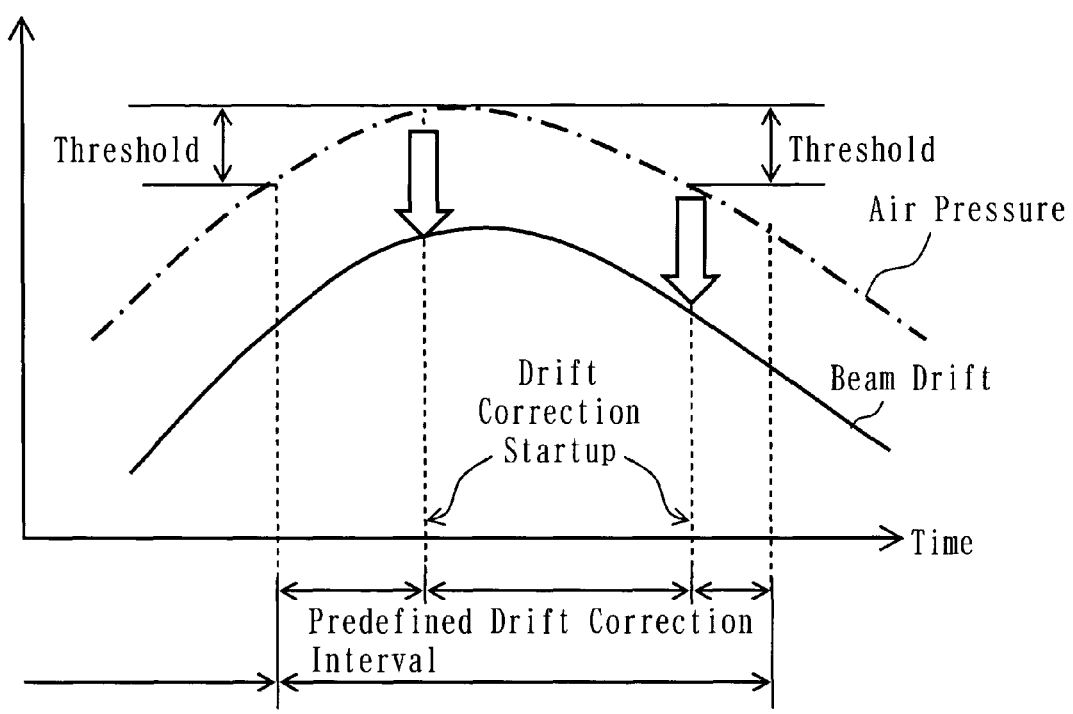
FIG. 9 is a graph showing curves of variations with time of atmospheric pressure and beam drift.

A relationship between the atmospheric pressure and the beam drift is shown in FIG. 9. By viewing this graph, it can be seen that a certain relation exists between variations of these factors. While the atmospheric pressure increases in value, the beam drift also increases in a direction. When the increasing air pressure turns to decrease, the beam drift also decreases in a direction opposite to the above-noted direction. Accordingly, mere execution of the periodical drift correction at predefined time intervals fails to keep track of such beam drift changes occurring due to changes in atmospheric pressure. To avoid this risk, this embodiment is specifically arranged to perform additional drift correction based on a measured value of atmospheric pressure outside of the lithography tool 100, in a way independent of the per-time periodical correction stated previously. The pressure is measured by the barometer 106 shown in FIG. 5.

The extra "disturbance-based" drift correction is generally shown at right-hand part of the flowchart of FIG. 1. More specifically, at step S202, the barometer 106 measures a present value of atmospheric pressure outside of the lithography apparatus 100 and then generates at its output a signal indicative of the measured pressure value. The air pressure measurement circuit 366 is responsive to receipt of this measurement signal for issuing and supplying a trigger signal to the beam drift measurement circuit 342 in case the atmospheric pressure changes by a degree equivalent to a predetermined change rate (threshold value) from the atmospheric pressure value in a previous beam drift correction session.

At step S206 the lithography tool 100 interrupts its pattern writing operation at the time point whereat the atmospheric pressure changes by the degree corresponding to the preset threshold level, causing the beam calibration mark 152 on XY stage 105 to move toward the center of objective lens 207 due to motion of XY stage 105 that supports thereon the workpiece 101. Then, the beam drift measurement circuit 342 measures a present value of beam drift by detection of the position of the cross joint of mark 152 through scanning using the electron beam 200.

At step S208, drift correction is performed. To do this, the correction value calculator circuit 350 drift correction is performed. More specifically, the correction value calculator circuit 350 uses the beam drift amount as measured by the drift measurement circuit 342 to determine through arithmetic computation a drift correction value. This value is then passed to the adder 372, which adds the drift correction value to the original design data value to generate a synthetic value. Replacing the design data thereby results in correction of the beam drift being presently found. An output signal of adder 374 indicative of such corrected design data is then combined or "synthesized" together with the position data of XY stage 105 as has been measured by laser length meter 300 and calculated by position calculator 109, thereby generating an output signal indicative of the combined value data, which is then sent to the deflection control circuit 320. This circuit uses this data to control an output voltage of deflection amp 322, which voltage is then used for deflection of the electron beam 200 by the deflector 208.

In step S210, the control unit 160 determines whether the pattern write is completed. If NO at step S210 then return to step S202 of measuring a variation in atmospheric pressure, followed by the processes of the above-noted steps S202 to S210 under control of the controller 160.

As shown in FIG. 9, even within the predefined drift correction interval, the drift correction function gets started in responding to a change in atmospheric pressure on a real-time basis. In this example, two drift correcting operations are additionally performed within the predefined drift correction time period. Unlike prior art approaches which are incapable of unconditionally lengthening the drift correction interval in order to retain handleability against irregularly occurrable disturbances, the embodiment is arranged so that more than one per-event or "per-disturbance" drift correction is done in addition to the periodical per-time drift correction while letting a change in disturbance factor, e.g., atmospheric pressure, be as a trigger therefor. Thus it is possible to sufficiently lengthen respective drift correction time intervals t1-t3 in the initial drift period shown in FIG. 6 and, if necessary, the drift correction intervals t4 in its following beam stabilized period. This makes it possible to reduce the required number of drift correction operations.

The correlation between the atmospheric pressure and beam position variation may be predefined by off-line measurement. For instance, where the deflection position is displaced or offset by 5 nanometers (nm) with a change of 1 hectopascal (hPa), if such 5-nm deviation is an allowable limit, then define system settings so that the drift measurement gets started every time a variation is found by 1 hPa as the threshold. In FIG. 9, when atmospheric pressure variations within the predefined drift correction time interval are less than 1 hPa, no such correction operations are performed while permitting continuous execution of the pattern write operation without any interruptions.

Figure 10:
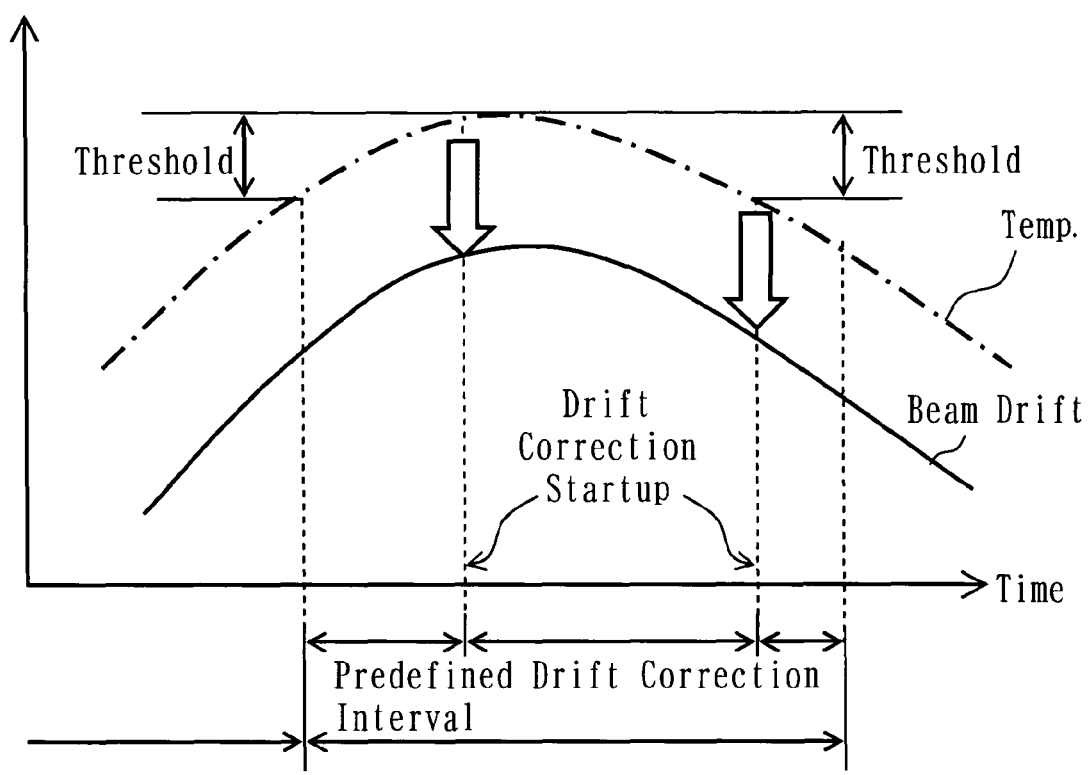
FIG. 10 is a graph showing curves of with-time variations of temperature and beam drift.

An exemplary relation of the temperature versus the beam drift is shown in FIG. 10. As shown in this graph, certain correlation exists therebetween. While the temperature increases, the beam drift also increases in a direction. As the temperature turns to decrease, the drift decreases in the opposite direction. Accordingly, when the temperature rapidly rises up or drops down, mere execution of the periodical drift correction at predefined time intervals fails to keep track of such beam drift changes occurring due to changes in temperature. In view of this, the illustrative embodiment is arranged to perform additional drift correction based on a measured value of temperature on the XY stage 105 in lithography tool 100, in a way independent of the above-noted periodical per-time beam drift correction. The temperature is measured by the thermometer 108 of FIG. 5.

At step S202, the thermometer 108 measures a temperature on the XY stage 105 and then generates at its output a signal indicative of the measured temperature value. The temperature measurement circuit 364 is responsive to receipt of this signal for supplying a trigger signal to the beam drift measurement circuit 342 in case the temperature changes by a degree equivalent to a predetermined change rate (threshold value) from the temperature value in a previous beam drift correction session.

At step S206 the lithography tool 100 interrupts its pattern writing operation at the time point whereat the temperature changes by the degree corresponding to the preset threshold level, causing the beam calibration mark 152 on XY stage 105 to move toward the center of objective lens 207 due to motion of XY stage 105 that supports the workpiece 101. Then the beam drift measurement circuit 342 measures a present value of beam drift by detection of the position of the cross joint of mark 152 through scanning using the electron beam 200.

At step S208, drift correction is performed. To do this, the correction value calculator circuit 350 drift correction is performed. More specifically, the correction value calculator circuit 350 uses the beam drift amount as measured by the drift measurement circuit 342 to determine through arithmetic computation a drift correction value. This value is then passed to the adder 372, which adds the drift correction value to the original design data value to generate a synthetic value. Replacing the design data thereby results in correction of the beam drift being presently found. An output signal of adder 374 indicative of such corrected design data is then combined or "synthesized" together with the position data of XY stage 105 as has been measured by laser length meter 300 and calculated by position calculator 109, thereby generating an output signal indicative of the combined value data, which is then sent to the deflection control circuit 320. This circuit uses this data to control an output voltage of deflection amp, which voltage is then used for deflection of the electron beam 200 by the deflector 208.

In step S210, the controller 160 determines whether the pattern write is completed. If NO at step S210 then return to step S202 of measuring a variation in atmospheric pressure, followed by the processes of the above-noted steps S202 to S210 under control of the controller 160.

As shown in FIG. 10, even within the predefined drift correction interval, the drift correction function gets started in responding to a change in temperature on a real-time basis. Here, two drift correcting operations are done within the predefined drift correction time period. The embodiment method is arranged so that more than one per-disturbance drift correction is carried out in addition to the per-time drift correction while letting a change in disturbance factor, e.g., temperature, be as a trigger therefor. Thus it is possible to sufficiently lengthen respective drift correction time intervals t1-t3 in the initial drift period shown in FIG. 6 and, if necessary, the drift correction intervals t4 in its following beam stability period. This makes it possible to reduce the required number of drift correction operations.

The correlation between the temperature and beam position variation is predefinable by offline measurement. For example, where the deflection position is offset by 5 nm with a change of 0.03° C., if such 5-nm deviation is the allowable limit, then define system settings so that the drift measurement gets started every time a variation is found by 0.03° C. as the threshold. In FIG. 10, when temperature variations within the predefined drift correction time interval are less than 0.03° C., no such correction operations are performed while permitting continuous execution of the pattern write operation without any interruptions.

Note here that during beam drift correction if the deflection position is corrected by a degree equal to the correction amount at a time then an offset of such deflection position between a presently executed correction session and its previous correction session can increase undesirably. An approach to avoiding this risk is to perform linear approximation or "interpolation" of an offset or deviation between the present drift position and its previous drift position and then estimate the next occurrable drift amount and next gradually shift the deflection position toward a target value thus estimated.

Figure 11A:
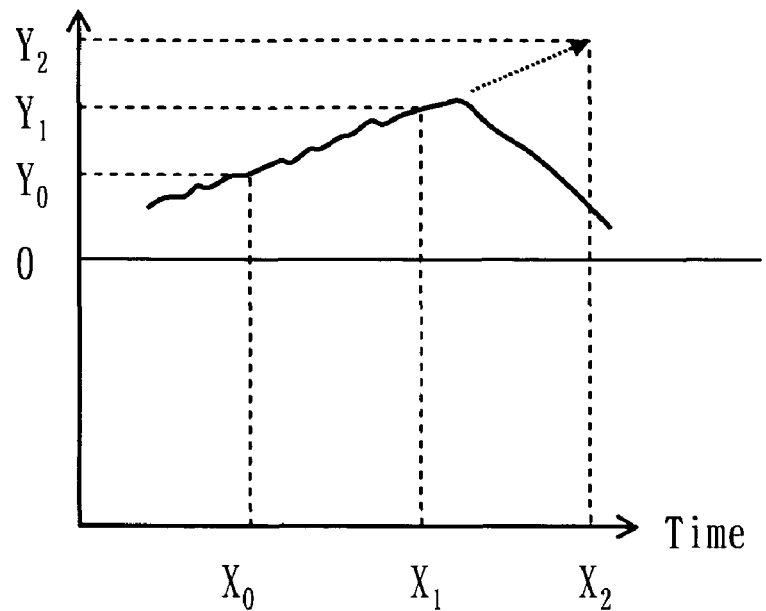
FIGS. 11A and 11B are diagrams for explanation of one exemplary beam drift correction method.
Figure 11B:
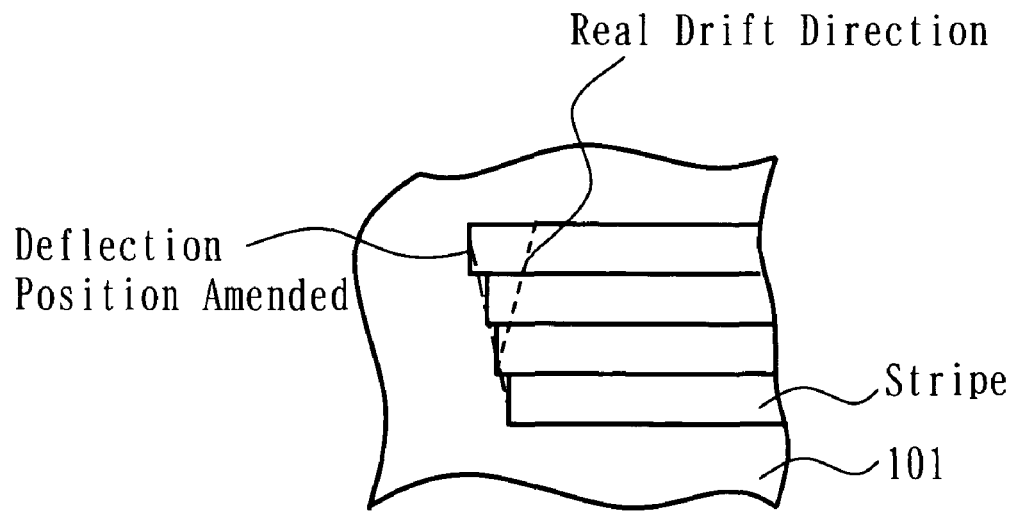

An exemplary beam drift correction process will be discussed with reference to FIGS. 11A-11B below. FIG. 11A shows a plot of beam drift versus time when only the periodical per-time drift correction is performed without addition of any additional per-event correction stated above. The resulting deflection positions corrected are shown in FIG. 11B. Obviously, a change in variation direction occurs between time points X1 and X2 in FIG. 11A results in a change in beam drift direction. However, in the case of mere execution of the periodical per-time drift correction shown in FIG. 11A, the correction direction is the same until the instant X2 whereat the next beam drift correction is done, so it will possibly happen that the deflection position is corrected in the opposite direction to the actual drift direction as shown in FIG. 11B.

Figure 12A:
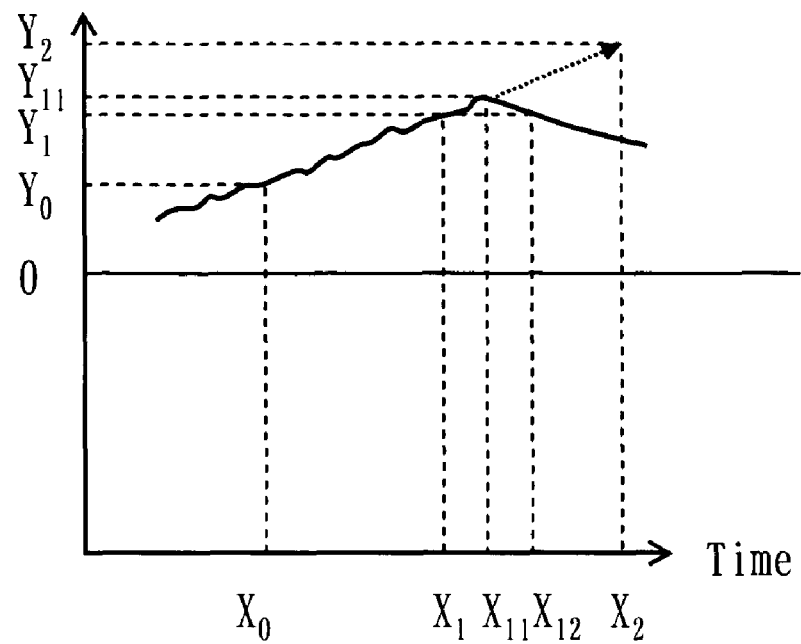
FIGS. 12A-12B are diagrams showing an example of the beam drift correction method incorporating the principles of the invention.
Figure 12B:
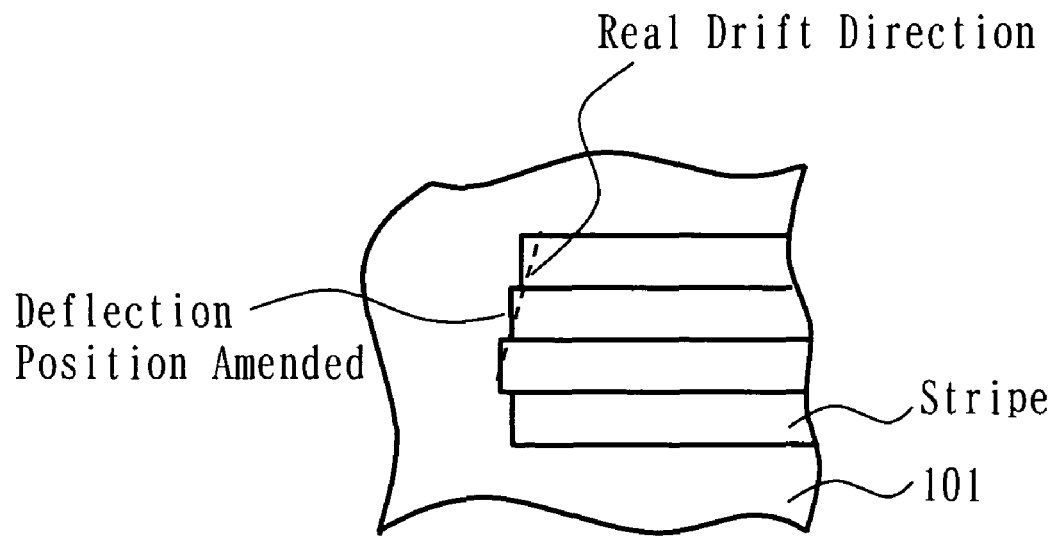

Turning to FIGS. 12A-12B, one example of the electron beam drift correction process embodying the invention will be discussed, which employs the per-event beam drift correction technique in addition to the periodical per-time correction process. A typical change in beam drift with time is shown in FIG. 12A, and the resulting deflection positions are shown in FIG. 12B. As a change in disturbance factor(s) exceeds a predefined threshold level within a time period between the per-time correction time points X1 and X2 in FIG. 12A, per-event drift correction is done a couple of times at instants X1 and X12 therebetween. Thus, superior correction is achieved by use of the deflection amount that keeps track of the actual drift direction as shown in FIG. 12B. This makes it possible to perform correction to the ameliorated or "right" deflection position pursuant to the actual drift direction.

As well demonstrated by comparison between the examples of FIGS. 11A-11B and 12A-B, doing drift correction with a disturbance change as a trigger on a real-time basis makes it possible to reduce the total number of drift correction operations required, thereby enabling shortening of measurement and calculation times necessary for the correction processing. Thus it is possible to speed up the pattern depiction as a whole while increasing throughputs.

It has been stated that the electron beam drift correction method embodying the invention is characterized by having in principle two kinds of correction processes—that is, a "regular" per-time beam drift correction process to be performed periodically per unit of length-variable time, and an occasional or "per-disturbance" drift correction to be done at any time a change in disturbance of interest goes beyond a predetermined level in a way irrespective of the elapse of time.

Whenever a value change in certain disturbance factor reaches a predetermined level, a drift of the electron beam is immediately corrected, thereby enabling provision of a trigger for the startup of measurement in addition to the periodical time-based scheme. This makes it possible, in the beam stability period subsequent to the initial drift period in which possible beam drifting or "migration" is kept less, to sufficiently lengthen the beam drift correction intervals as an alternative approach to shortening such interval in the initial drift period.

One preferable example of the disturbance factor for use in the disturbance-triggered drift correction process is atmospheric pressure outside of the lithography tool 100.

Another example of the disturbance factor is a temperature on the surface of XY stage 105, with or without co-use of the outside atmospheric pressure.

A further feature of the electron beam drift correction method lies in that a trigger is provided for getting the beam drift correcting operation started independently of the per-time correction scheme.

An electron beam drift correction method is also provided which is for correcting drifts of an electron beam after the elapse of a prespecified length of time period from the startup of beam irradiation, the method being featured by including the steps of measuring the value of a disturbance factor, measuring a drift amount of the electron beam when the measured value of the disturbance factor reaches a predetermined change level, and using this measured beam drift amount to correct a deflection amount of the electron beam.

With such an arrangement, it is possible especially in the beam stabilized period to correct the deflection of the electron beam in responding as a trigger to an event in which the measured value of disturbance factor reaches a predetermined change level without use of a time-based limiter.

According to the above-stated embodiment, it is possible to further reduce the number of drift correction operations while keeping pace with disturbances. This makes it possible to speed up the pattern depiction while improving efficiency and throughputs.

Embodiment 2

Figure 13:
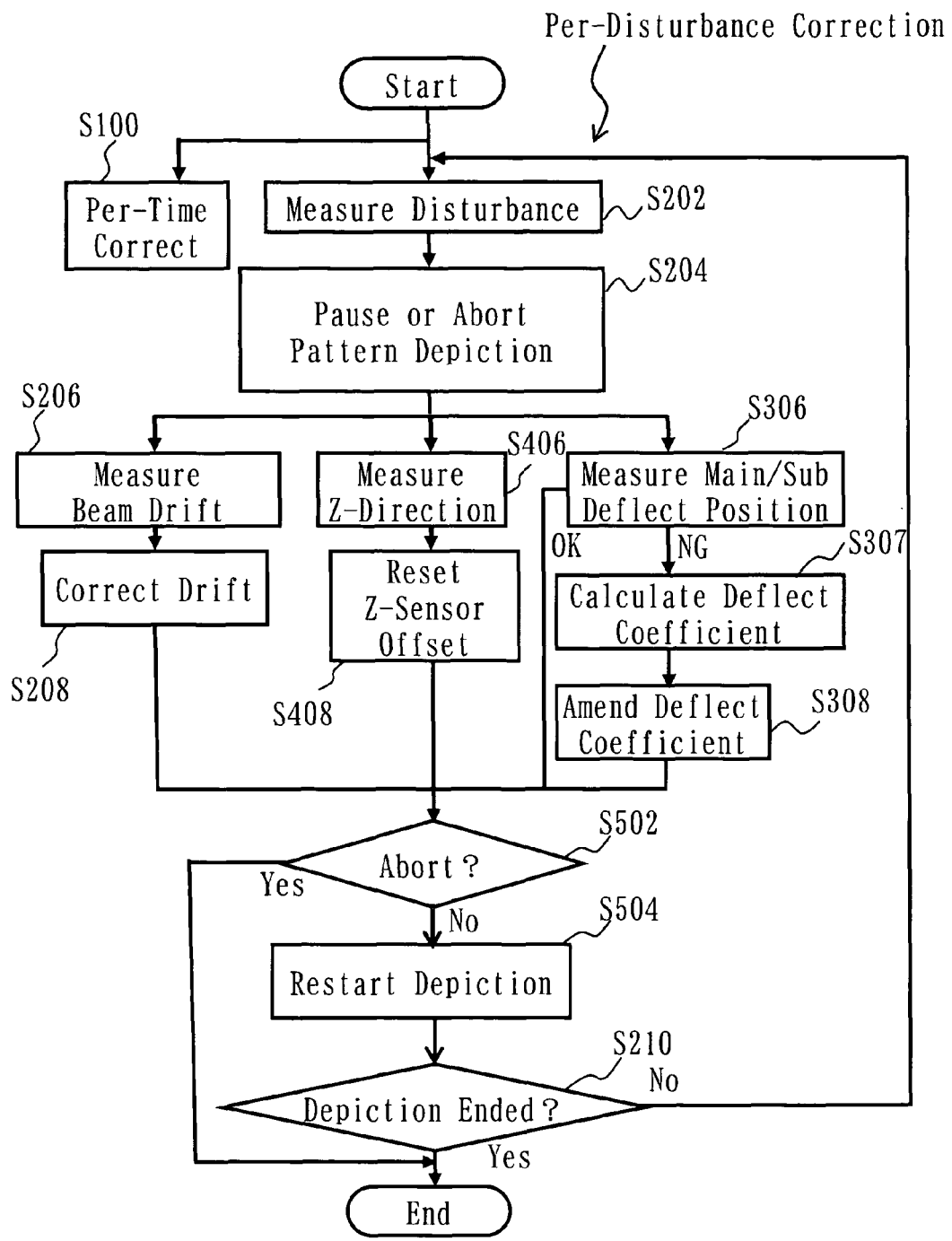
FIG. 13 is a flowchart of some major process steps of an electron beam drift correction method also embodying the invention, which steps include main/sub-deflection coefficient correction and Z-sensor offset correction.

Turning to FIG. 13, an electron beam drift correction method also embodying the invention is shown in flowchart form, which method includes processes of correcting main and auxiliary deflection coefficients along with an offset of Z sensor.

This method performs electron beam drift correction in a similar way to that of the method of the previous embodiment shown in FIG. 1—that is, it performs the periodical per-time beam drift correction at length-variable time intervals and, in addition thereto, the per-disturbance drift correction to be performed at any time when a change in certain disturbance factor value becomes greater than or equal to a predetermined level. The periodical correction is done at steps S100 through S112 of FIG. 1, although these steps are not shown herein for purposes of convenience in the drawing. The per-disturbance correction is performed at steps S202 to S210 shown in FIG. 13, including pattern write interruption at step S204, beam drift measurement at step S206, drift correction at step S208, main/sub-deflection position measurement at step S306, deflection coefficient calculation at step S307, deflection coefficient modification at step S308, Z-direction measurement at step S406, Z sensor offset resetting at step S408, abort decision at step S502, and pattern writing at step S504, which steps will be described in detail later.

Figure 14:
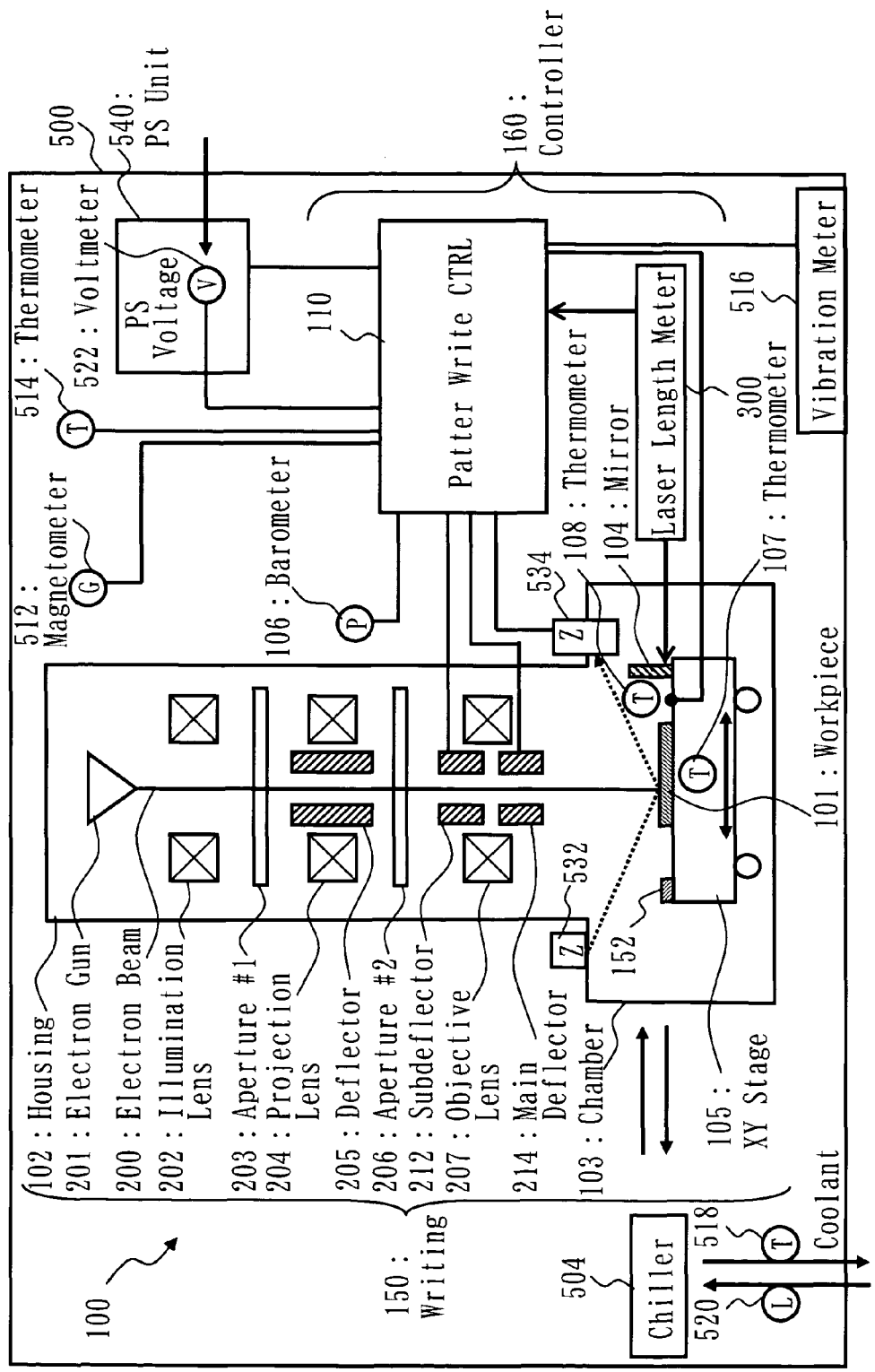
FIG. 14 shows a configuration of a scanning electron beam pattern writing apparatus in accordance with another embodiment of the invention.

An EB lithography system adaptable for use with the correction method is shown in FIG. 14 in block diagram form. The EB writing apparatus 100 is generally made up of a pattern writing unit 150, control unit 160 and power supply module 540. The unit 150 is similar to that shown in FIG. 2, except for the following arrangements. The lower deflector 208 of FIG. 2 is divided into two parts, i.e., a main deflector 214 and a subsidiary or "ancillary" deflector 212. A thermometer 107 is disposed on the XY stage 105 in addition to the thermometer 108 near the workpiece 101. A thermometer 107 measures a temperature of upper or lower part of the XY stage 105. The pattern writing unit 150 has its pattern writing chamber 103, in which is disposed a Z sensor as a Z-axis (optical axis) detection optics including a light beam projector 532 and photosensor 534. The light projector 532 may typically be a semiconductor laser or photodiode. Photosensor 534 may preferably be a position sensitive device (PSD). Several measurement instruments associated with the EB lithography system are disposed in the interior of a clean room 500, including a barometer 106 for measurement of atmospheric pressure outside of the barrel 102, a thermometer 514 for measuring a temperature in cleanroom 500, a magnetometer 512 for measuring the intensity of a magnetic field therein, and a vibration meter or gauge 516 as placed on or above the floor of cleanroom 500 for measuring vibrations thereof. The power supply (PS) module 540 is connected to the control unit 160 having the pattern write control circuit 110 and laser-assisted length meter 300. PS module 540 includes a voltage meter or voltmeter 522 operable to measure a potential level of primary power supply voltage as supplied from fab facility (not shown). Cleanroom 500 also includes a cooling machine 504, called "chiller," which provides temperature controls so that the pattern writing chamber 103 is kept at a fixed temperature, like a constant temperature bath. The chiller 504 is operatively associated with a flow rate meter 520 and a coolant temperature meter 518, wherein the former is for measurement of a flow rate of primary cooling water being supplied to chiller 504 from the fab facility (not shown) whereas the latter measures a temperature of the coolant water as drained from chiller 504. Other known parts or components are included in the EB lithography apparatus 100, although these are not specifically illustrated in FIG. 14.

An electron beam 200 leaving the electron gun 201 passes through the illumination lens 202 to enter the first aperture 203, which has a rectangular beam-shaping opening or hole. Passing this hole results in the electron beam 200 being shaped to have a rectangular cross-section. Then, the electron beam 200 is guided by the projection lens 204 to reach the second aperture 206. A first aperture image on second aperture 206 is position-controlled by the deflector 205 so that the beam changes in shape and in size dimensions. After having passed through second aperture 206, the electron beam 200 with a second aperture image is focus-adjusted by the objective lens 207 and then deflected by the main deflector 214 and subdeflector 212 to finally fall onto a target workpiece 101 at a desired position thereon, which workpiece is placed on the movable XY stage 105. A present location of XY stage 105 is optically measured on a real-time basis in such a way that the laser device 300 emits a beam of laser light hitting the mirror 104 on XY stage 105 and then receives reflected light from mirror 104.

In this embodiment system also, the workpiece 101 on XY stage 105 is subjected to pattern writing or depiction by the serpentine beam scanning technique as has been previously discussed with reference to FIG. 3.

Figure 15:
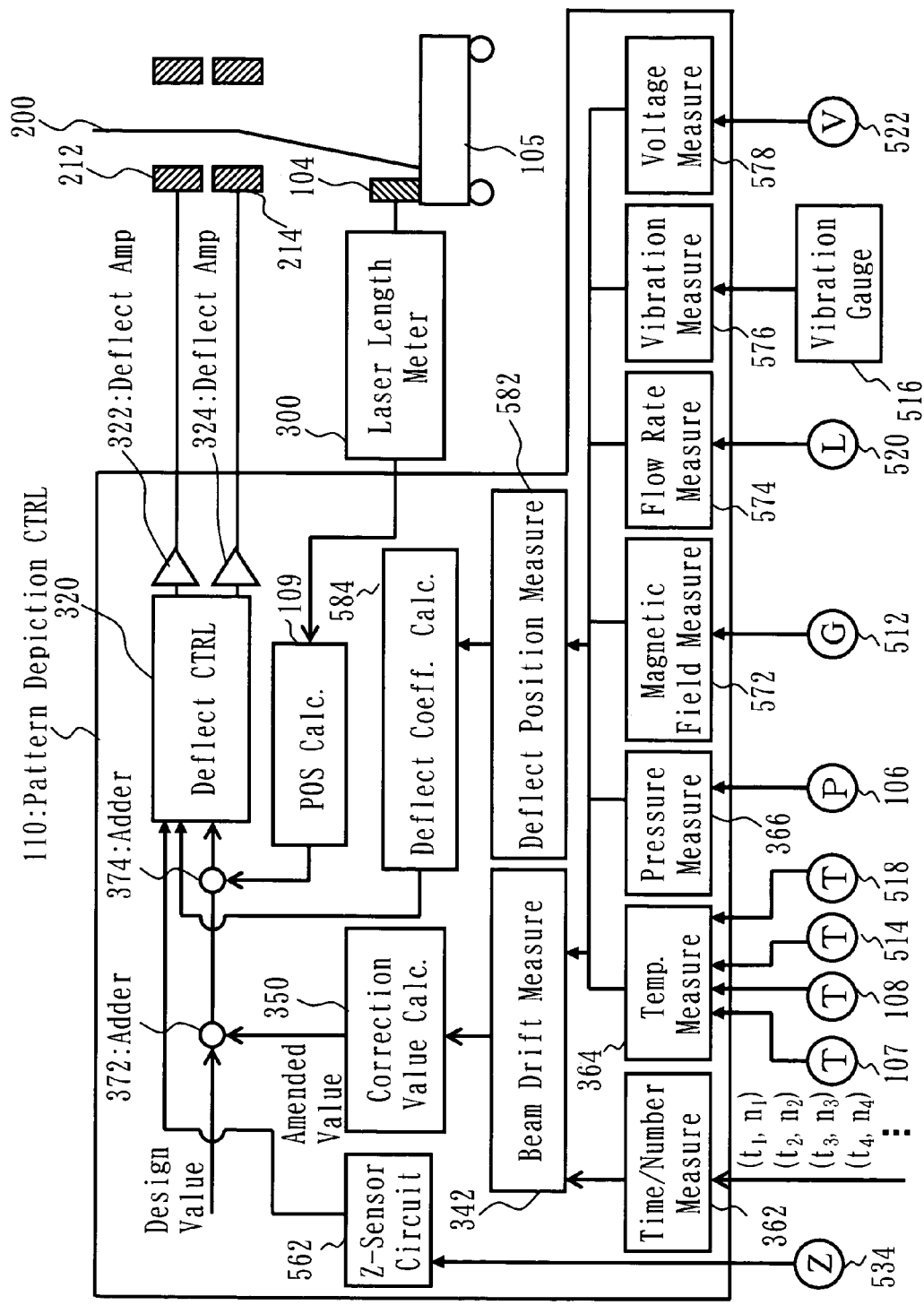
FIG. 15 is a block diagram showing an internal arrangement of a control circuit in the apparatus of FIG. 14.

An internal configuration of the pattern write control circuit 110 of FIG. 14 is shown in FIG. 15. As shown herein, this controller 110 includes a deflection control circuit 320, deflection amplifiers 322-324, beam drift measurement circuit 342, correction value calculation circuit 350, time/number measurement circuit 362, temperature measurement circuit 364, atmospheric pressure measurement circuit 366, adders 372-374, position calculator circuit 109, Z sensor circuit 562, magnetic intensity measurement circuit 572, flow rate measurement circuit 574, vibration measurement circuit 576, voltage measurement circuit 578, deflection position measurement circuit 582, and deflection coefficient computation circuit 584.

The deflection control circuit 320 is connected to the deflection amplifiers 322-324, the adder 374, the Z sensor circuit 562, and the deflection coefficient computation circuit 584. The adder 374 is connected to the deflection control circuit 320 at its output, and adder 372 and the position calculator 109 at its input. The adder 372 is connected to the adder 374 at its output, and the calculator 350. A output signal value from the correction value calculating circuit 350 is added by adder 372 to a design value. The correction value calculating circuit 350 is connected to the beam drift measurement circuit 342. The beam drift measurement circuit 342 is connected to the time/number measurement circuit 362, the temperature measurement circuit 364, the atmospheric pressure measurement circuit 366, the magnetic intensity measurement circuit 572, the flow rate measurement circuit 574, the vibration measurement circuit 576, and the voltage measurement circuit 578. The deflection coefficient computation circuit 584 is connected to the deflection position measurement circuit 582. The deflection position measurement circuit 582 is connected to the temperature measurement circuit 364, the atmospheric pressure measurement circuit 366, the magnetic intensity measurement circuit 572, the flow rate measurement circuit 574, the vibration measurement circuit 576, and the voltage measurement circuit 578. The amplifier 322 is connected to the sub-deflector 212. The amps 322 generate amplified drive voltages to sub-deflectors 212, respectively. Applying the drive voltage to sub-deflector 212 results in an electron beam 200 being deflected within a sub-deflection plane. Similarly, the amplifier 324 is connected to the main-deflector 214. The amps 324 generate amplified drive voltages to main-deflectors 214, respectively. Applying the drive voltage to sub-deflector 214 results in an electron beam 200 being deflected within a main-deflection plane. The length meter 300 is connected to the position calculator 109. a length measurement output signal of laser-assisted length meter 300 is calculated to a position data by the position calculator 109. The Z sensor circuit 562 is connected to the receiver 534, which receives the light beam, as the Z sensor. The temperature measurement circuit 364 is connected to the thermometer 107, the thermometer 108, the thermometer 514, and the thermometer 518. The atmospheric pressure measurement circuit 366 is connected to the atmospheric pressure barometer 106. The magnetic intensity measurement circuit 572 is connected to the magnetometer 512. The flow rate measurement circuit 574 is connected to the flow rate meter 520. The vibration measurement circuit 576 is connected to the vibration meter 516. The voltage measurement circuit 578 is connected to the voltmeter 522. Other known parts or components are included in the writing control circuit 110, although these are not specifically illustrated in FIG. 15.

Referring back to FIG. 13, the electron beam drift correction process starts with step S100, which corrects drifts of the electron beam 200 periodically, i.e., once per unit of time period. This periodical beam drift correction is similar to that shown in FIG. 1, having the steps S102 to S112.

At step S202 of FIG. 13, the various types of measurement instruments 106-108 and 512-522 shown in FIG. 14 or 15 operate to monitor and measure respective kinds of disturbance factors, i.e., atmospheric pressures, temperatures, etc. If any one of the disturbance factors varies in value from either a preset default value or a value resulted from previous beam drift correction up to a prespecified change value (threshold level), then its corresponding measurement circuit generates at its output a trigger signal for startup of a per-disturbance beam drift correcting operation on a per-event basis.

This embodiment method is arranged to employ, in addition to the XY stage top-surface temperature and outside atmospheric pressure as used in the previous embodiment, several disturbance factor values such as a temperature at lower part of XY stage 105, an inside temperature of the clean room 500, a magnetic field in cleanroom 500, a vibration therein, a potential of the power supply voltage as fed to the power supply module 540, a flow rate of the primary coolant water fed to the chiller 504, and a temperature of such water as drained therefrom. Whenever at least one of these disturbance factors changes in value to an extent equal to or more than a threshold level as predefined thereto, a beam correction startup-triggering signal is generated by its corresponding measurement circuit. As for these disturbance factors also, a specific correlation exists relative to the variation of beam drift.

Exemplary threshold value settings are as follows. For the XY stage temperature at its upper or lower part to be measured by the thermometer 107 or the temperature near the workpiece 101 to be measured by the thermometer 108 of FIG. 15, a reference or "threshold" value is set to 0.03° C. When the temperature changes to exceed this value, the temperature measurement circuit 364 generates a trigger signal. For the cleanroom temperature being measured by the thermometer 514, its threshold value is set at plus/minus (±) 0.02° C. relative to an average temperature value. For the outside atmospheric pressure measured by the barometer 106, its threshold is set at 1 hPa. For the magnetic field around the electron lens barrel 102 measured by the magnetometer 512, its threshold value is 0.3 mG. As for the vibration measured by vibration meter 516, when it is less than 10 Hz in frequency and becomes greater than 0.02 m/s$^2$, a trigger signal is generated by the measurement circuit 576. For the power supply voltage measured by the voltmeter 522, when it potentially varies by more than 10%, a trigger signal is output from circuit 578. For the primary coolant water being measured by thermometer 518, when it goes beyond a range of 15 to 25° C., a trigger signal is issued from circuit 364. For the flow rate of the coolant to be measured by flow meter 520, when this value becomes less than 30 litters per minute, a trigger signal is output from circuit 574.

At step S204 of FIG. 13, the pattern write controller 110 is responsive to receipt of a trigger signal from any one of the measurement circuits 364-366 and 572-578 shown in FIG. 15, for interrupting a presently executed pattern writing operation of the EB lithography apparatus 100. In this event, the apparatus 100 is operating to draw or write the pattern in units of strip-like regions as previously discussed using FIG. 3. Upon receipt of the trigger signal, the pattern writing is paused after completion of a presently pattern-written stripe. This temporal stop is called the "pause stripe." Using this scheme results in retention of the unit of pattern writing, thereby enabling achievement of high-accuracy pattern image forming capabilities.

Preferably two different values are provided for the threshold level of a change amount of each disturbance factor. When a change in the disturbance of interest reaches a smaller threshold value, pause the pattern write operation after having completed a presently executed per-stripe writing session. If such disturbance change reaches a larger threshold value, then judge an abnormal situation occurs and thus immediately interrupt or "abort" the pattern write operation even during execution of the per-stripe write session. With the "two-stage" decision scheme, in case a disturbance varies in excess of the small threshold value, it is possible to perform another processing by provision of the large threshold value. In case a disturbance change significantly exceeds the small threshold value during pattern writing of a stripe, let it immediately interrupt this per-stripe write, thereby making it possible to prevent occurrence of pattern displacement with impermissibly deteriorated accuracy, which takes place due to continuation of its remaining part in spite of the significant disturbance change. An example is as follows: when a vibration with its frequency less than 10 Hz changes to exceed 0.01 m/s$^2$, pause the per-stripe pattern writing; upon detection of large vibrations due to an earthquake, force the pattern write operation per se to bring to completion immediately.

Next, in any one of these cases of the per-stripe write pause session and the due-to-abnormality completion (abort), perform as a diagnosis menu the beam drift correction and main/sub-deflection sensitivity verification plus correction thereof, followed by resetting of an offset of the Z sensor. Performing these diagnosis-menu tasks even in the abort case makes it possible to make preparation for the next pattern writing. In the abort case also, the Z-sensor offset resetting may be done in addition to the diagnosis tasks when the need arises.

At step S206 of FIG. 13, the beam drift amount measurement is performed in a way which follows. When the beam drift measurement circuit 342 of FIG. 15 inputs a trigger signal from any one of the disturbance factor measurement circuits 364-366 and 572-578, move the XY stage 105 so that its beam calibration mark 152 moves to the center of objective lens 207 while the pattern depiction is paused temporarily. Then, drift measurement circuit 342 detects this mark 152's cross joint through scanning of the electron beam 200, thereby to measure a beam drift amount.

Then, at step S208, the correction value calculator 350 uses the drift amount to determine through arithmetic computation a correction value as used for the beam drift correction. This value is then passed to the adder 372, which adds together this value and the original design data value to generate an added value. By rewriting the design data, correct beam drifting. This corrected design data is added and combined by the adder 374 with data indicative of a present position of XY stage 105 as output from the position calculator 109 so that the deflection controller 320 generates at its output a deflection control signal for deflection adjustment. This voltage signal is amplified by the deflection amps and then applied to the deflector 212-214, which deflects the electron beam 200.

As the disturbance factors, in particular, the outside atmospheric pressure, can affect the main and sub-deflection sensitivities, this embodiment is arranged to perform, in addition to and independently of the beam drift correction, checking of the in-plane deflection sensitivity of the main deflector 214 and that of subdeflector 212 and, if necessary, correct the deflection sensitivities within an allowable range in a way described below.

At step S306, deflection positions of the main and sub-deflectors are measured. More specifically, when the deflection amount measurement circuit 582 inputs a trigger signal from any one of the disturbance measurement circuits 364-366 and 572-578, move the XY stage 105 so that its beam calibration mark 152 moves to the center of objective lens 207 while the pattern depiction is paused temporarily. Then, deflection position measurement circuit 582 measures a present position of the mark 152 by beam scanning thereon while deflecting the electron beam 200 by the main and sub-deflectors 214 and 212 at respective positions.

Figure 16:
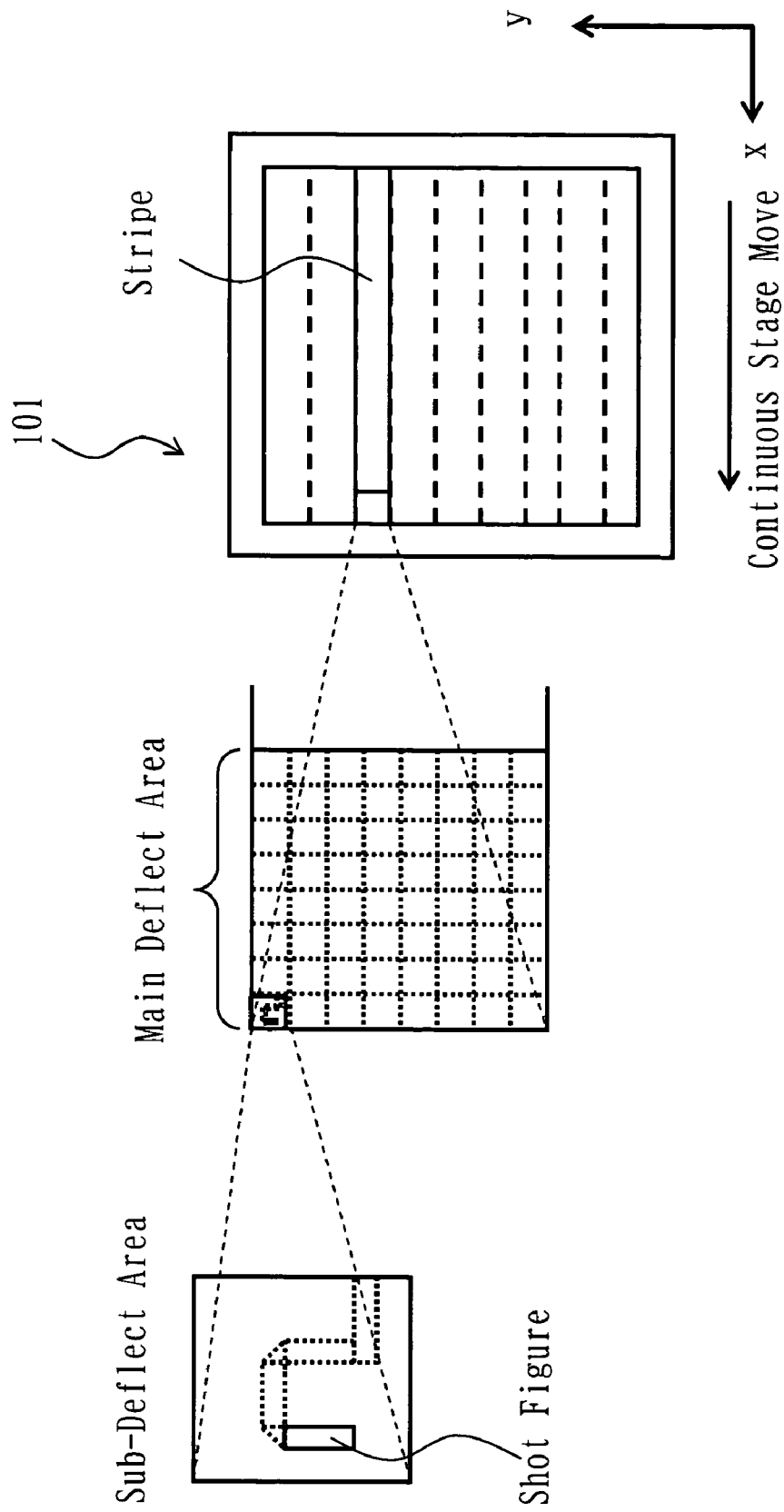
FIG. 16 shows a plan view of a workpiece along with main and sub-deflection regions of an original or "master" pattern to be transferred to the workpiece.

Exemplary main and sub-deflection regions are shown in FIG. 16. In case a pattern is written onto the workpiece 105, e.g., mask, in EB lithography tool 100, its pattern write plane is divided into several strip-like unit regions in the Y direction, each of which has a width along which the beam is deflectable by the main deflector 214. Each stripe is further divided in X direction into portions having the same width as that in Y direction, resulting in a matrix of rows and columns of small square regions. Each row of these "tile"-like regions is a main deflection region, along which the beam is deflectable by main deflector 214. Each column is a sub-deflection region, also called a "sub-field."

The subdeflector 212 is used to accurately control at high speeds the position of electron beam 200 on a per-shot basis. Hence, the deflection range is narrow as shown in FIG. 16 and limited to the subfields on a mask blank. Beam deflection in excess of this range is done by movement of the position of a subfield by main deflector 214. On the contrary, the main deflector 214 is used to control the subfield position for permitting movement within a range in which a plurality of subfields are included (i.e., main deflection region). During pattern writing, the XY stage 105 is driven to move in X direction continuously, so it is possible to keep track of the movement of XY stage 105 by moving (tracking) the depiction origin of a subfield with the aid of main deflector 214.

Figure 17:
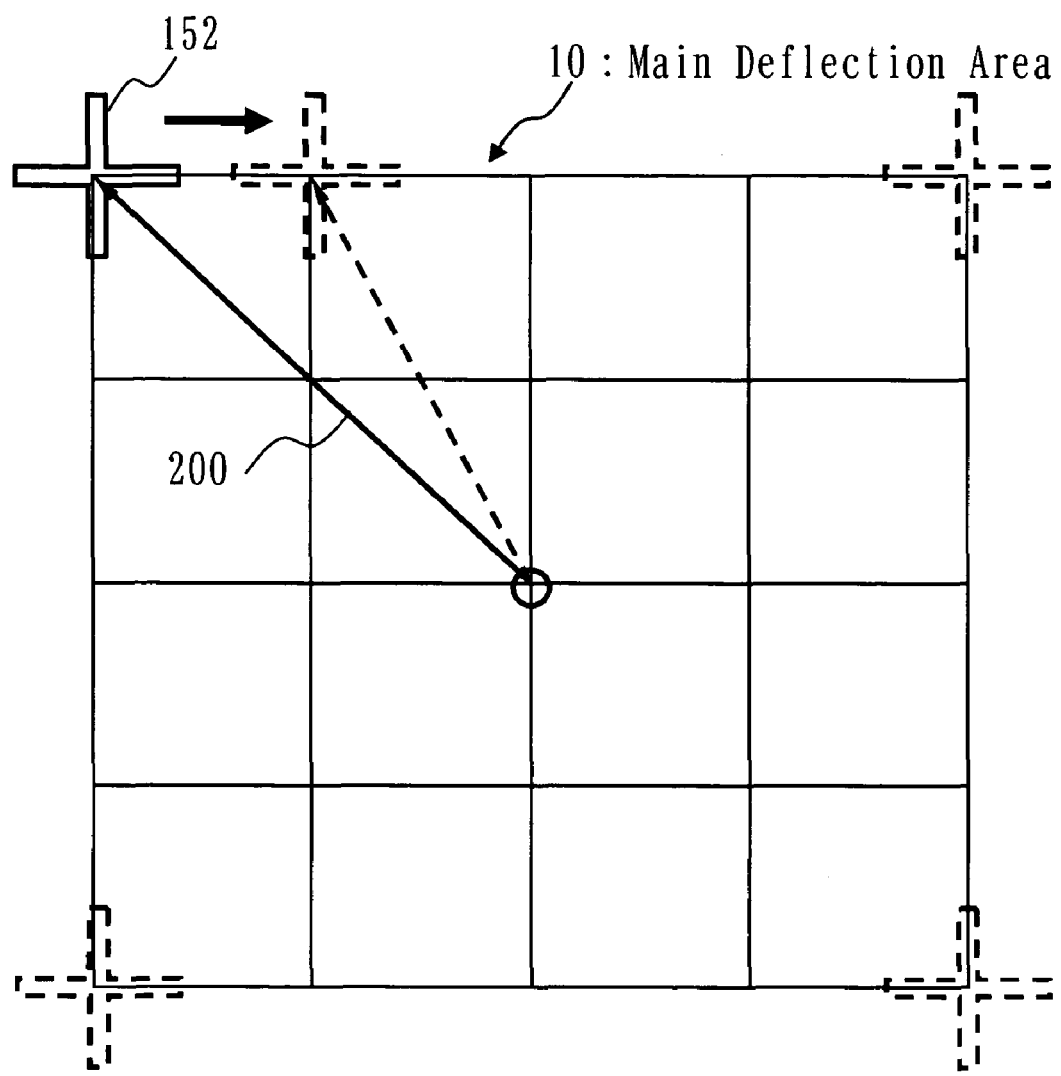
FIG. 17 shows an enlarged plan view of part of the workpiece surface during mark position measurement.

A mark position measurement technique employable in this embodiment is as follows. As shown in FIG. 17, move the XY stage 105 so that the mark 152 is moved to a respective desired position within the main deflection region 10. Then, deflect the electron beam 200 to each position within region 10. Next, measure the mark 152's position to obtain its residual difference. Here, this is repeated for a total twenty five points, i.e., a matrix of five rows of five columns of target points, within the main deflection region 10.

Figure 18:
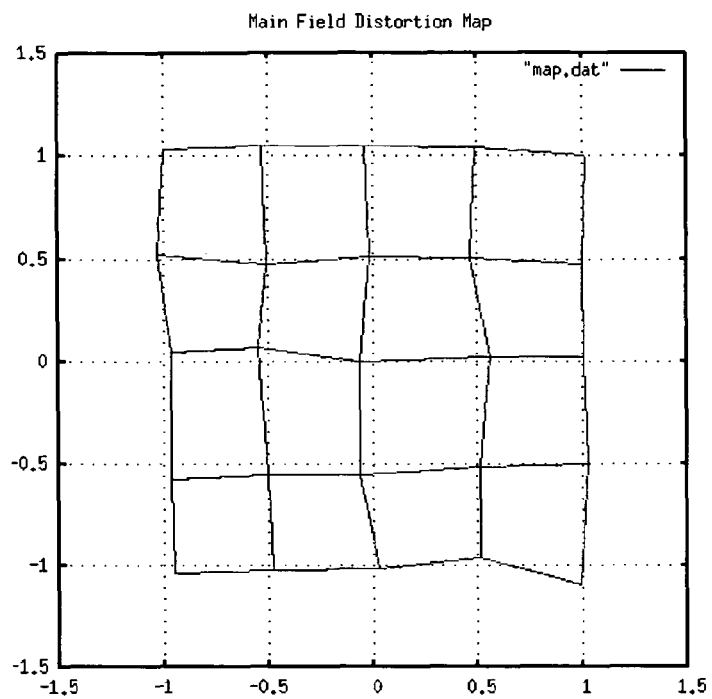
FIG. 18 is a graph showing a mark position measurement result in the apparatus of FIG. 14; and, FIG. 19 shows plots of residual errors of the mark position in X- and Y-axis directions.
Figure 19:
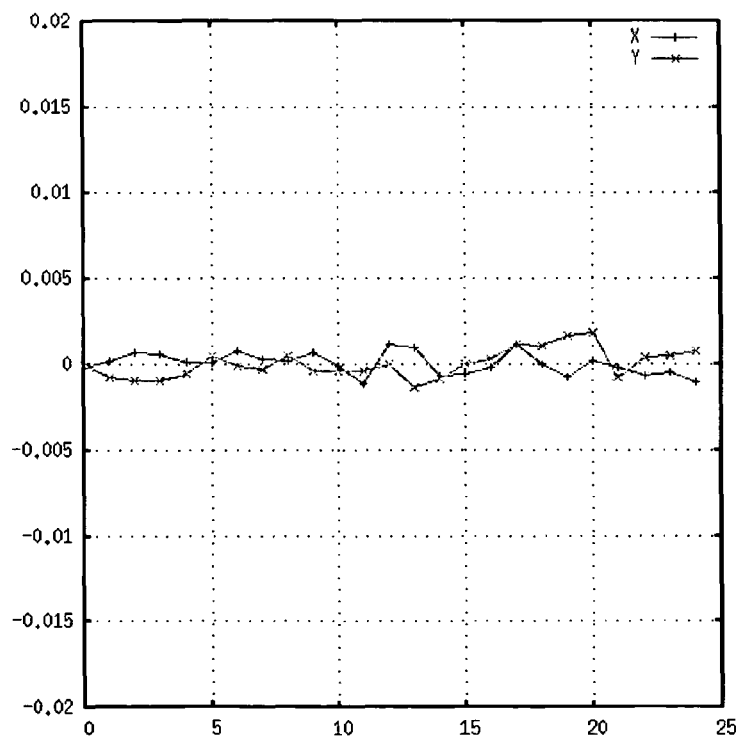

An example of the mark position measurement result is graphically shown in FIG. 18. Exemplary plots of mark position residual differences in X and Y directions are shown in FIG. 19. In case a correction residual difference as obtained from the result of FIG. 18 is less as shown in FIG. 19, e.g., if a positional deviation (residual difference) falls within a range of ±5 nm in both the X and Y directions, then go next to step S502 of FIG. 15. In the event that the pattern write interruption is the "pause stripe," this operation gets restarted.

Figure 20:
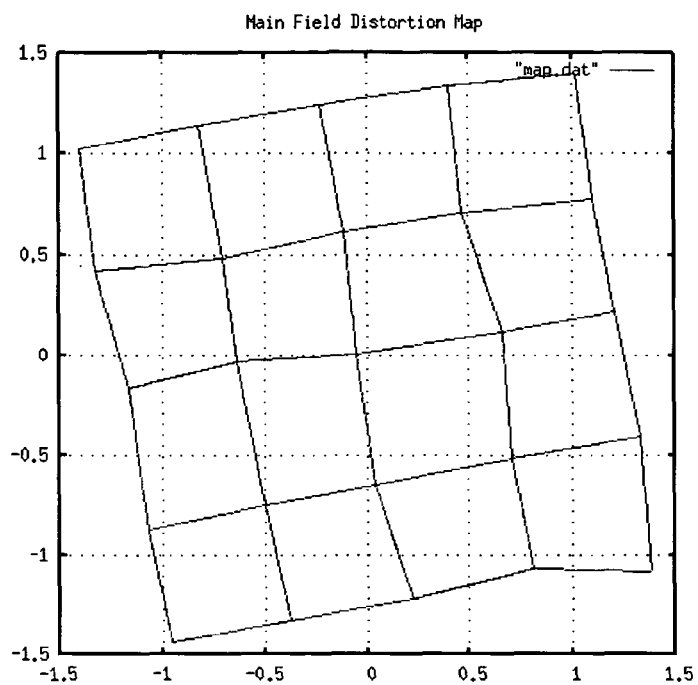
FIG. 20 is a graph showing another mark position measurement result in the FIG. 14 apparatus.
Figure 21:
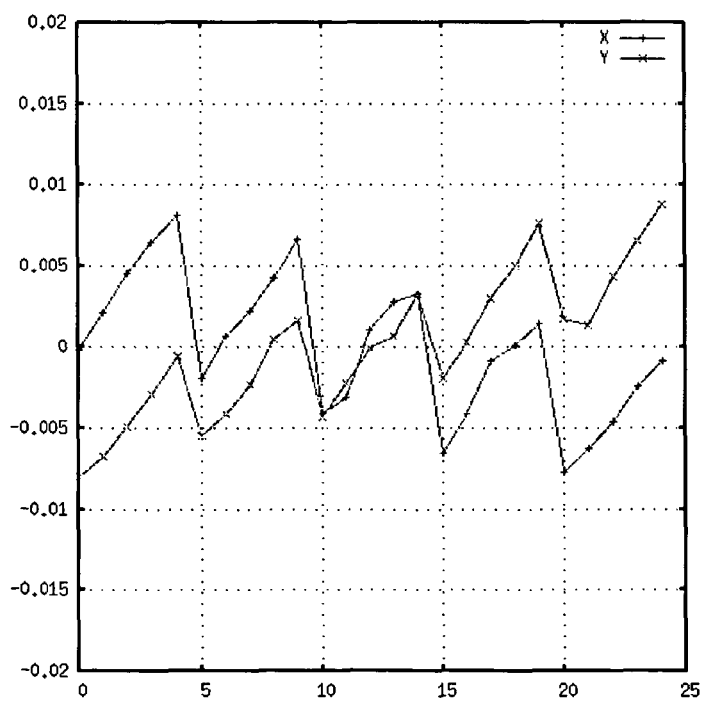
FIG. 21 shows plots of residual errors of the mark position in X and Y-axis directions.

Another exemplary mark position measurement result is shown in FIG. 20, with its corresponding mark position residual differences in X and Y directions being plotted in FIG. 21. In case a correction residual difference as obtained from the result of FIG. 20 is large as shown in FIG. 21, e.g., if a positional deviation (residual difference) goes beyond the range of ±5 nm in both X and Y directions then go to step S307 which corrects the deflection coefficient in a way to be described later. In brief, whenever an error with its value exceeding 5 nm is detected in the main deflection sensitivity, correct the deflection coefficient. The same goes with the subdeflection. For example, a matrix of three rows and three columns of target points (nine in total) is defined within the main deflection area 10, for mark position measurement at respective points.

At step S307, deflection coefficient calculation is performed in a way which follows. The calculator 584 of FIG. 15 uses the resultant deflection position to determine through computation a deflection coefficient(s) of a relational expression which defines a deflection quantity at each position of the writing area.

In step S308, the deflection coefficient calculator 584 performs correction by setting the resulting deflection coefficient(s) as a parameter(s) to the deflection controller 320.

The disturbance factors, esp., atmospheric pressure, can also affect the optical axis of Z sensor 532, which is in the process of detecting a position in Z-axis direction (Z position) of the pattern depiction plane of workpiece 101. This embodiment method is arranged to perform, in addition to and independently of the above-stated beam drift correction and the main/sub-deflection sensitivity correction, correction or "amendment" of an offset value of the Z sensor that determines the Z position on the depiction plane in a way discussed below.

At step S406, when a trigger signal is output from any one of the disturbance factor measurement circuits 364-366 and 572-578 of FIG. 15, the pattern write operation is either paused or brought to completion. Simultaneously, let the XY stage 105 move so that the mark 152 is at a desired position. Then, the Z sensor circuit 562 detects a present position of the mark 152 in Z direction.

Figure 22:
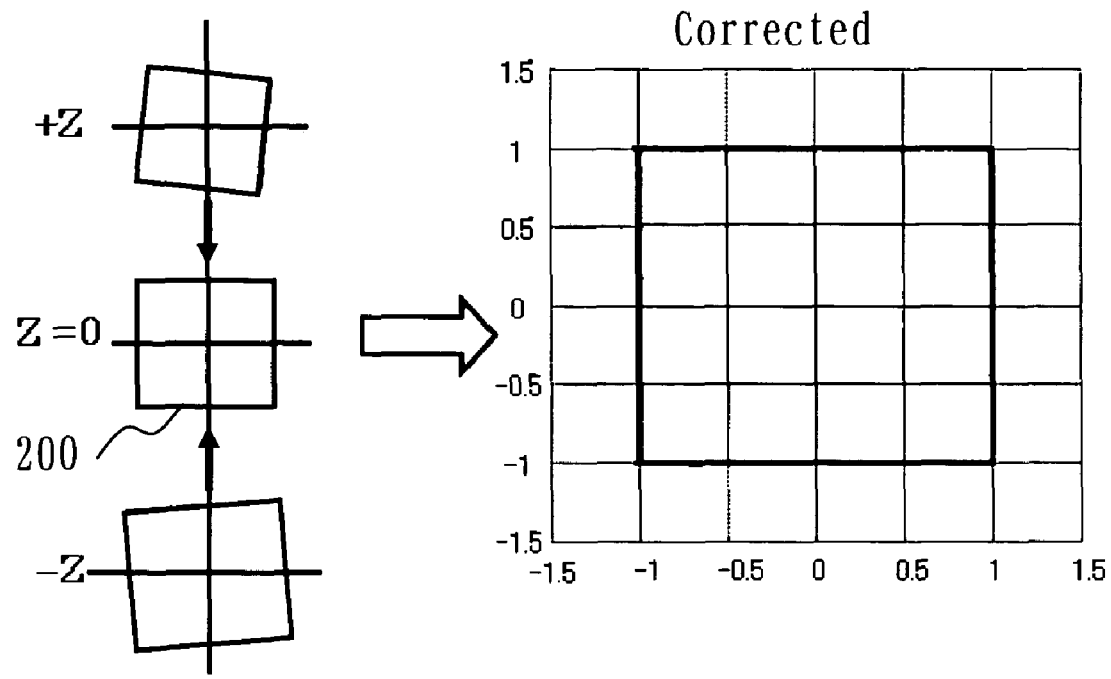
FIG. 22 is a diagram for explanation of the influenceability of angular displacement in an optical axis direction.
Figure 24:
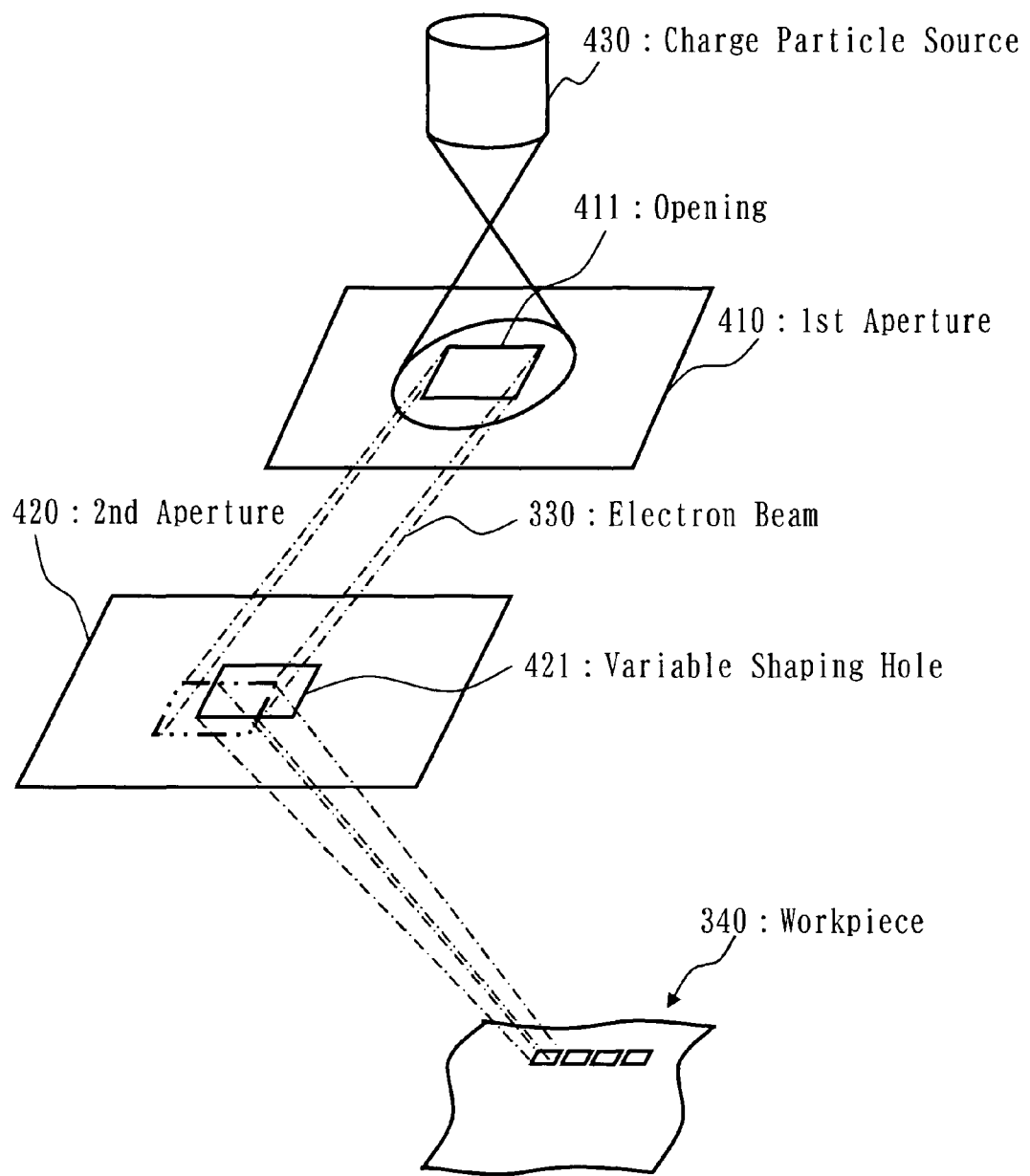
FIG. 24 is a pictorial representation of the behavior of an electron beam in prior known variable-shaped electron beam photolithography apparatus.

The influence of deviation in the optical axis direction (Z direction) will be discussed with reference to FIG. 22. The electron beam 200 is guided by the main deflector 214 and subdeflector 212 to travel along a curved pathway or "orbit." When setting the offset position so that Z-direction deviation is zero, if the pattern depiction plane is displaced in Z direction by either +Z or −Z, the electron beam 200 irradiated varies in position as shown in FIG. 24. To compensate this, the Z sensor module having in combination the light projector 532 and photosensor 534 operates to detect the Z-direction position of the workpiece 101.

Figure 23:
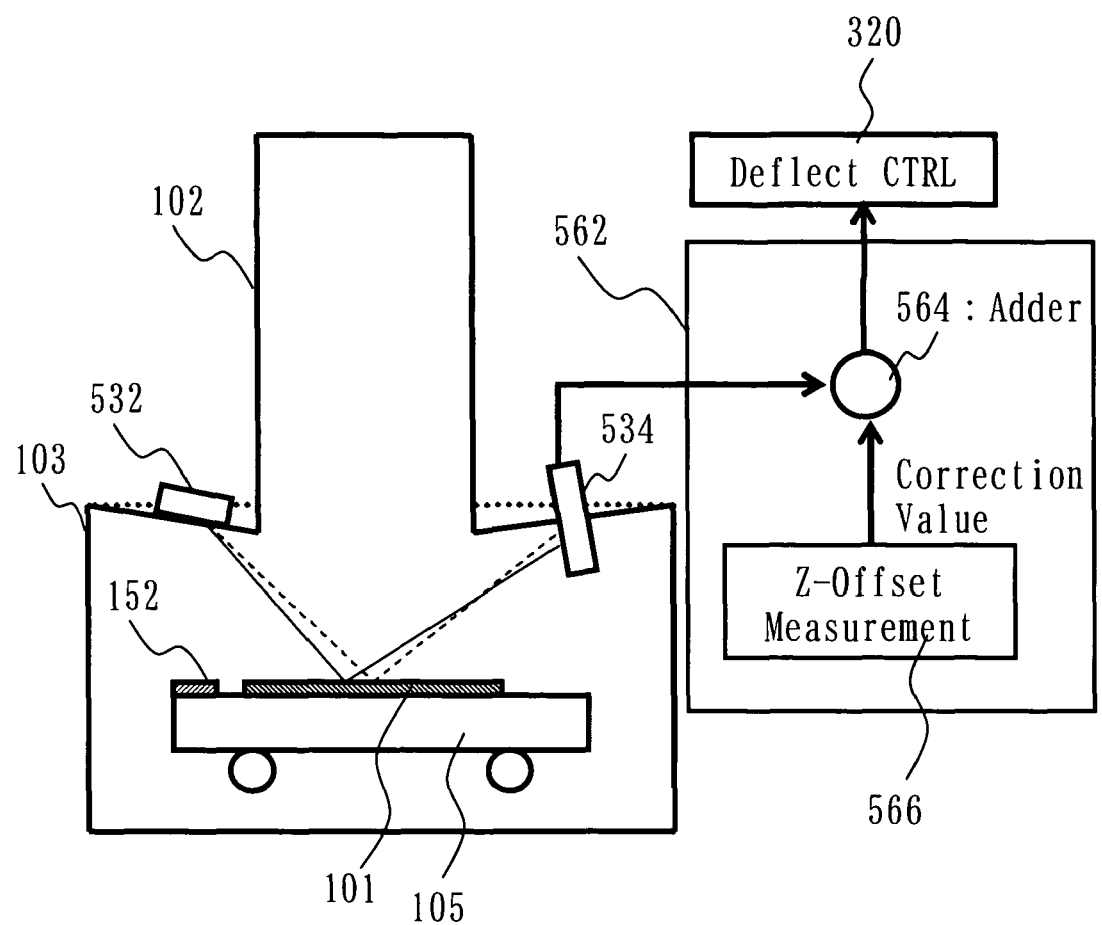
FIG. 23 shows a Z sensor used in the FIG. 14 apparatus and its associated optical axis deviation measurement circuitry.

More precisely, as shown in FIG. 23, the pattern writing chamber 103 can deform at its ceiling due to changes in disturbance factors—especially, by changes in atmospheric pressure outside of it. This causes the light projector 532 and photosensor 534 to change in positional relationship therebetween, resulting in occurrence of zero-point displacement (Z offset) of the Z-direction position. Thus a need arises to reset this Z offset.

This Z-sensor offset resetting is done at step S408. To do this, the Z sensor circuit 562 sets the offset so that a read value of the photosensor 534 indicative of a detected Z-direction position of the mark 152 becomes zero. For example, as shown in FIG. 23, the photosensor 534 is connected to a Z-offset amount measurement circuit 566 in the Z sensor circuit 562. This circuit 566 measures the mark 152's Z-axis position and then calculates a correction value which forces the read value of photosensor 534 upon detection becomes equal to zero. The correction value is added by an adder 564 to the "rare" read value and is then supplied as an updated offset value signal to the deflection control circuit 320. In responding to receipt of this signal as a value-reset trigger in this way, the deflection controller 320 enables correction of the deflection position in a way such that the pattern write is performed with high precision at a new position corresponding to the updated offset value thus reset.

At step S502, the system controller 160 determines whether a presently interrupted pattern writing operation at step S204 is the abort or not. If YES at this decision step S502 then finish the pattern writing operation without restart thereof. If NO at step S502, i.e., when it is the "pause stripe," go to step S504 which restart the pattern write operation.

At step S210, the controller 160 determines whether the pattern write is completed. If NO then return to step S202, followed by repeated execution of its following steps S204 to S210 until the end of the pattern depiction.

Although in the embodiment the beam drift correction and the main/sub-deflection sensitivity correction plus the Z-sensor offset resetting are arranged so that each gets started independently of the others whenever a change in any disturbance factor reaches a prespecified level, the order of sequence of such operation is not limited thereto and the operation may be started at any one of them. Preferably the main/sub-deflection sensitivity correction is first performed since the pattern writing is abandoned due to the presence of an error of deflection sensitivity during the main/sub-deflection sensitivity correction. If this is the case, its following processes of the beam drift correction and Z sensor offset reset may be eliminated in the event of such abandonment.

In the flowchart of FIG. 13, the beam drift measurement step S206 and main/sub-deflection measurement step S306 plus Z-direction measurement S406 are modifiable so that measurement is done after the disturbance factor of interest with its change reaching a predetermined level has returned to a preset range in which its value becomes normal.

These per-disturbance correction processes may bring appreciable effects after the beam drifting enters its period of stability. Additionally the periodical per-time correction process at step S100 is modifiable so that the correction time interval is shortened or "narrowed" when any disturbance factor reaches its prespecified change level.

While the invention has been disclosed and illustrated with reference to particular embodiments, the invention should not exclusively be limited thereto. For example, in the stability period after startup of irradiation of the electron beam 200, the beam drift correction may be modified so that the periodical drift correction is eliminated to perform only the disturbance change-triggered drift correction on a per-event basis. This results in a further decrease in number of correction processes required. The disturbance factors may be those beam-driftable factors other than the atmospheric pressure and temperatures, such as a change in magnetic field. The thermometer 108 disposed on XY stage 105 shown in FIG. 2 may be placed at other locations, such as a position inside of XY stage 105 as indicated by "T" in FIG. 2, e.g., a location between an X stage and a Y stage.

Although those system components and control schemes which are deemed less relevant to the principles of the invention are not specifically described herein, these may be reduced to practice by using appropriate ones on a case-by-case basis. For example, the EB lithography apparatus 100 may come with several controllers other than the control unit 160, which are implementable by adequately chosen hardware or software arrangements.

Any other energy particle beam lithography systems, energy beam drift correction methods, main/sub-deflection sensitivity correction processes, Z-sensor offset resetting techniques and energy beam pattern writing methods, which incorporate the principles of the invention and which are design-modifiable by those skilled in the art should be interpreted to be included within the coverage of the invention.

Additional advantages and modification will readily occur to those skilled in the art. The invention in its broader aspects is not limited to the specific details and representative embodiments shown and described herein. Various modifications may be made without departing from the spirit or scope of the general inventive concept as defined by the appended claims and their equivalents.

What is claimed is:

1. A method for correcting drifts of an electron beam, comprising:
   periodically correcting drift of the electron beam once per time period while varying the time period in length;
   measuring a value of a specified disturbance factor; and
   correcting, in addition to the correction per time period, the drift of the electron beam regardless of elapse of said time period when a change in value of the specified disturbance factor occurs with a prespecified change amount,
   wherein the specified disturbance factor is at least one of a temperature, a magnetic field, a flow rate of coolant water, and a power supply voltage,
   a drift correcting interval for the correction per time period is kept shorter soon after a startup of pattern writing and the drift correcting interval is made longer as the pattern writing proceeds with time.

2. The method according to claim 1, wherein a relation of said specified disturbance factor and the drift of the electron beam is measured beforehand off-line, and said prespecified change amount is determined as an amount of change of said specified disturbance factor occurring when the drift reaches a permissible limit.

3. The method according to claim 1, wherein said method is used as one of processes to be performed by a pattern writing apparatus using the electron beam to write a pattern and wherein when correction is done by a change in the value of said disturbance factor, the electron beam drift correction is done after completion of writing of a certain unit part.

4. The method according to claim 1, wherein during the periodical correction per unit of the time period, said time period is shortened upon occurrence of the change of the disturbance factor value with the prespecified change amount.

5. An electron beam drift correction method comprising:
   (a) periodically correcting drift of an electron beam once per elapse of a time period while varying the time period in length;
   (b) measuring a value of a trigger; and
   (c) providing the trigger for start-up of drift correction of the electron beam in a way independent of step (a),
   wherein at least one of values of a temperature, a magnetic field, a flow rate of coolant water, and a power supply voltage is used as the trigger,
   a drift correcting interval for the correction per time period is kept shorter soon after a startup of pattern writing and the drift correcting interval is made longer as the pattern writing proceeds with time.

6. A method for correcting drift of an electron beam after elapse of a specified time period from startup of irradiation of the electron beam, said method comprising:
   periodically correcting drift of the electron beam once per time period while varying the time period in length;
   measuring a value of a certain disturbance factor;
   when the measured value of said disturbance factor reaches a predetermined change amount, measuring a drift degree of the electron beam; and
   using the measured drift degree of said electron beam to correct a deflection amount thereof,
   wherein the disturbance factor is at least one of a temperature, a magnetic field, a flow rate of coolant water, and a power supply voltage,
   a drift correcting interval for the correction per time period is kept shorter soon after a startup of pattern writing and the drift correcting interval is made longer as the pattern writing proceeds with time.

7. An electron beam writing method comprising:
   writing using an electron beam deflectable by a deflector;
   periodically correcting drift of the electron beam once per time period while varying the time period in length;
   during the writing, measuring a value of certain disturbance factor;
   when the measured value of the disturbance factor reaches a predefined change level, measuring a drift amount of the electron beam;
   correcting a deflection degree of said electron beam based on the measured drift amount of the electron beam;
   dividing said predefined change level into first and second sublevels, the second sublevel being greater than the first sublevel;
   when a change in the value of the disturbance factor reaches said first sublevel, correcting a drift amount of the electron beam after having written a unit part of said pattern; and
   when the disturbance value change reaches said second sublevel, immediately finishing the pattern writing,
   wherein the disturbance factor is at least one of a temperature, a magnetic field, a flow rate of coolant water, and a power supply voltage, and
   a drift correcting interval for the correction per time period is kept shorter soon after a startup of pattern writing and the drift correcting interval is made longer as the pattern writing proceeds with time.

8. The method according to claim 7, further comprising:
when a change in value of the disturbance factor reaches said predefined change level, temporarily pausing the pattern writing after having written a unit part of a writing area; and
after the disturbance change value returns to fall within a preset range, measuring the drift amount of said electron beam.

9. An electron beam writing method comprising:
writing by use of an electron beam being deflected by a deflector;
periodically correcting drift of the electron beam once per time period while varying the time period in length;
during the writing, measuring a value of a chosen disturbance factor;
correcting, in addition to the correction per time period, the drift of the electron beam regardless of elapse of said time period when a change in value of the disturbance factor occurs with a prespecified change amount;
when the measured value of the disturbance factor reaches a predefined change level, measuring a deflection position of the electron beam within a deflection range of said deflector;
dividing said predefined change level into first and second sublevels, the second sublevel being greater than the first sublevel;
when a change in the value of the disturbance factor reaches said first sublevel, measuring the deflection position of the electron beam after having written a unit part of said pattern; and
when the disturbance value change reaches said second sublevel, immediately terminating the writing,
wherein the disturbance factor is at least one of a temperature, a magnetic field, a flow rate of coolant water, and a power supply voltage, and
a drift correcting interval for the correction per time period is kept shorter soon after a startup of pattern writing and the drift correcting interval is made longer as the pattern writing proceeds with time.

10. The method according to claim 9, wherein the deflection position of said electron beam is measured after completion of the writing of a unit part of a writing area.

11. The method according to claim 9, further comprising:
when a change in the value of said disturbance factor reaches said predefined change level, temporarily stopping the writing after having written a unit part of a writing area; and
after said value of the disturbance factor returns to fall within a preset value range, measuring a deflection position of said electron beam.

12. The method according to claim 9, wherein the value of said disturbance factor is at least one of values of an outside atmospheric pressure, a temperature, a magnetic field, a flow rate of coolant water and a power supply voltage.

13. The method according to claim 9, further comprising:
modifying a deflection coefficient of said deflector based on the measured deflection position of said electron beam.

14. The method according to claim 13, wherein when a deviation of the measured deflection position of said electron beam exceeds a predefined value, correction is made to the deflection coefficient of said deflector.

15. An electron beam writing method comprising:
writing by an electron beam on a workpiece with its position in a Z direction being detected by a Z sensor;
periodically correcting drift of the electron beam once per time period while varying the time period in length;
during the writing, measuring a value of a disturbance factor;
correcting, in addition to the correction per time period, the drift of the electron beam regardless of elapse of said time period when a change in value of the disturbance factor occurs with a prespecified change amount;
when the value of the disturbance factor thus measured reaches a predetermined change level, using a mark as provided on or above a stage with said workpiece being placed thereon to measure a position of the mark in the Z direction;
correcting an offset value of said Z sensor based on the measured position in said Z direction;
dividing said predefined change level into first and second sublevels, the second sublevel being greater than the first sublevel;
when a change in the value of the disturbance factor reaches said first sublevel, measuring the position of the mark in the Z direction after having written a unit part of a writing area; and
when the disturbance value change reaches said second sublevel, immediately terminating the writing,
wherein the disturbance factor is at least one of a temperature, a magnetic field, a flow rate of coolant water, and a power supply voltage, and
a drift correcting interval for the correction per time period is kept shorter soon after a startup of pattern writing and the drift correcting interval is made longer as the pattern writing proceeds with time.

16. The method according to claim 15, wherein the value of said disturbance factor is at least one of values of a temperature, a magnetic field, a flow rate of coolant water and a power supply voltage.

* * * * *